(12) United States Patent
Reznik

(10) Patent No.: US 8,879,634 B2
(45) Date of Patent: Nov. 4, 2014

(54) CODING BLOCKS OF DATA USING ONE-TO-ONE CODES

(75) Inventor: Yuriy Reznik, Seattle, WA (US)

(73) Assignee: QUALCOMM Incorporated, San Diego, CA (US)

( * ) Notice: Subject to any disclaimer, the term of this patent is extended or adjusted under 35 U.S.C. 154(b) by 484 days.

(21) Appl. No.: 13/196,626

(22) Filed: Aug. 2, 2011

(65) Prior Publication Data

US 2012/0039384 A1 Feb. 16, 2012

Related U.S. Application Data

(60) Provisional application No. 61/373,741, filed on Aug. 13, 2010.

(51) Int. Cl.
| | | |
|---|---|---|
| *H04N 7/12* | (2006.01) | |
| *H04N 11/02* | (2006.01) | |
| *H04N 11/04* | (2006.01) | |
| *H03M 7/30* | (2006.01) | |
| *H04N 19/61* | (2014.01) | |

(52) U.S. Cl.
CPC ........... *H03M 7/30* (2013.01); *H04N 19/00781* (2013.01)
USPC ............... 375/240.2; 375/240.01; 375/240.02

(58) Field of Classification Search
USPC .............................. 375/240.01, 240.02, 240.2
See application file for complete search history.

(56) References Cited

U.S. PATENT DOCUMENTS

| | | | |
|---|---|---|---|
| 7,265,691 B2 | 9/2007 | Tomic | |
| 7,626,522 B2 | 12/2009 | Reznik | |
| 2006/0055569 A1* | 3/2006 | Tomic | ............................. 341/50 |
| 2008/0097757 A1 | 4/2008 | Vasilache | |
| 2008/0111722 A1 | 5/2008 | Reznik | |
| 2009/0234642 A1 | 9/2009 | Mittal et al. | |
| 2009/0234644 A1 | 9/2009 | Reznik et al. | |
| 2010/0141489 A1 | 6/2010 | Reznik | |

OTHER PUBLICATIONS

International Search Report and Written Opinion—PCT/US2011/046449—ISA/EPO—Jan. 16, 2012.
Bross et al., "WD4: Working Draft 4 of High-Efficiency Video Coding," 6th Meeting: JCTVC-F803_d2, Torino, IT, Jul. 14-22, 2011, 226 pp.
Bross et al., "WD5: Working Draft 5 of High-Efficiency Video Coding," 7th Meeting: Geneva, Switzerland, Nov. 2011, JCTVC-G1103_d2, 214 pp.
Bross et al., "High efficiency video coding (HEVC) text specification draft 6," 7th Meeting: Geneva, CH, Nov. 21-30, 2011, JCTVC-H1003, 259 pp.
Bross et al., "High efficiency video coding (HEVC) text specification draft 7," 9th Meeting: Geneva, CH, Apr. 27-May 7, 2012, JCTVC-I1003_d2, 290 pp.

(Continued)

*Primary Examiner* — Chikaodili E Anyikire
(74) *Attorney, Agent, or Firm* — Shumaker & Sieffert, P.A.

(57) ABSTRACT

In general, techniques are described for coding data defining a sequence using one-to-one codes. An apparatus comprising a processing unit and a storage unit may implement the techniques. The processing unit decodes the index using a combinatorial enumeration process to generate a sequence. The index identifies the sequence in an array of all possible sequences ordered according to probabilities of the possible sequences assuming the possible sequences are produced by a memoryless source. The combinatorial enumeration process reorders sequences from the memoryless source according to the corresponding probabilities. The storage unit stores the sequence.

51 Claims, 8 Drawing Sheets

(56) References Cited

OTHER PUBLICATIONS

Bross et al., "High efficiency video coding (HEVC) text specification draft 8," 10th Meeting: Stockholm, SE, Jul. 11-20, 2012, JCTVC-J1003_d7, 261 pp.

Bross et al., "High Efficiency Video Coding (HEVC) text specification draft 9," 11th Meeting: Shanghai, CN, Oct. 10-19, 2012, JCTVC-K1003_v7, 290 pp.

Bross et al., "High Efficiency Video Coding (HEVC) text specification draft 10," 12th Meeting: Geneva, CH, Jan. 14-23, 2013, JCTVC-L1003_v34, 310 pp.

ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.

Wiegand et al., "WD1: Working Draft 1 of High-Efficiency Video Coding", JCTVC-C403, 3rd Meeting: Guangzhou, CN, Oct. 7-15, 2010, 137 pp.

Wiegand et al., "WD2: Working Draft 2 of High-Efficiency Video Coding," JCTVC-D503, Jan. 20-28, 2011, 153 pp.

Wiegand et al., "WD3: Working Draft 3 of High-Efficiency Video Coding," Document JCTVC-E603, 5th Meeting: Geneva, CH, Mar. 16-23, 2011,193 pp.

Reply to Written Opinion dated Jan. 16, 2012, from International application No. PCT/US2011/046449, filed Jun. 12, 2012, 6 pp.

International Preliminary Report on Patentability—PCT/US2011/046449, The International Bureau of WIPO—Geneva, Switzerland, Oct. 4, 2012, 11 pp.

Notification Concerning Informal Communication with the Applicant from International application No. PCT/US2011/046449, dated Jul. 27, 2012, 5 pp.

Reply to Notification Concerning Informal Communication with the Applicant dated Jul. 27, 2012, from International application No. PCT/US2011/046449, filed Aug. 27, 2012, 53 pp.

Dai et al., "Binary Combinatorial Coding," Proceedings of the Data Compression Conference, Mar. 25-27, 2003, p. 420. Date of current version: Apr. 22, 2003.

ITU-T H.264, Series H: Audiovisual and Multimedia Systems, Infrastructure of audiovisual services—Coding of moving video, Advanced video coding for generic audiovisual services, Mar. 2010, 674 pp.

MacMillan, "Two inequalities implied by unique decipherability," IRE Trans. Information Theory, vol. 2, pp. 115-116, Dec. 1956.

Leung-Yan-Cheong et al., "Some Equivalences between Shannon Entropy and Kolmogorov Complexity," IEEE Trans. Information Theory, 24, 331-338, 1978.

Dunham, "Optimal noiseless coding of random variables," IEEE Trans. Information Theory, vol. IT-26, No. 3, p. 345, May 1980.

Rissanen, "Tight lower bounds for optimum code length," IEEE Trans. Information Theory, vol. IT-28, No. 2, pp. 348349, Mar. 1982.

Verriest, "An achievable bound for optimal noiseless coding of a random variable," IEEE Trans. Information Theory, vol. IT-32, No. 4, pp. 592-594, Jul. 1986.

Weidmann, "New Upper Bounds on the Expected Length of One-to-one Codes," 2002 IEEE International Symposium on Information Theory, Lausanne, Switzerland, Jun. 30-Jul. 5, 2002, 1 pp.

Savari et al., "Bounds on the Expected Cost of One-to-One Codes," 2004 IEEE Int.Symp. Information Theory, p. 92, Chicago, IL, Jul. 2004.

Alon et al., "A Lower Bound on the Expected Length of One-to-One Codes," IEEE Trans. Information Theory, 40, 1670-1672, 1994.

Blundo et al., "New bounds on the expected length of one-to-one codes," IEEE Trans. Information Theory, vol. 42, pp. 246-250, Jan. 1996.

Cheng et al., "New Bounds on the Expected Length of Optimal One-to-One Codes," vol. 53, No. 5, pp. 1884-1895, May 2007.

Szpankowski, "One-to-One Code and Its Anti-Redundancy," IEEE Trans. Information Theory, vol. 54, pp. 4762-4766, Oct. 2008.

Verdu, "teaching it," XXVIII Shannon Lecture, 2007 IEEE International Symposium on Information Theory, Nice, France, Jun. 28, 2007. Also: IEEE Information Theory Society Newsletter, Dec. 2007.

Szpankowski et al., "Minimum Expected Length of Fixed-to-Variable Lossless Compression of Memoryless Sources", ISIT'09, 5 pp., Aug. 18, 2009.

Krichevsky et al., "The Performance of Universal Encoding," IEEE Trans. Inform. Theory, vol. 27, No. 2, pp. 199-207, 1981.

Cover, "Enumerative Sources Encoding," IEEE Trans. Inform. Theory, vol. 19, No. 1, pp. 73-77, 1973.

Schalkwijk, "An Algorithm for Source Coding," IEEE Trans. Inform. Theory, vol. 18, No. 3, pp. 395-399, 1972.

Szpankowski et al., "Minimum expected length of fixed-to-variable lossless compression of memoryless sources," ISIT 2009, IEEE, Jun. 28, 2009, pp. 369-373.

Invitation to Pay Additional Fees from international application No. PCT/US2011/046449 , dated Oct. 28, 2011, pp. 10.

* cited by examiner

US 8,879,634 B2

1

CODING BLOCKS OF DATA USING ONE-TO-ONE CODES

This application claims the benefit of U.S. Provisional Application No. 61/373,741, filed Aug. 13, 2010, which is hereby incorporated by reference in its entirety.

TECHNICAL FIELD

This disclosure relates to data compression and, more particularly, data compression using one-to-one codes.

BACKGROUND

Data compression is widely used in a variety of applications to reduce consumption of data storage space, transmission bandwidth, or both. Example applications of data compression include digital video, image, speech, and audio coding. Digital video coding, for example, is used in wide range of devices, including digital televisions, digital direct broadcast systems, wireless communication devices, personal digital assistants (PDAs), laptop or desktop computers, digital cameras, digital recording devices, video gaming devices, cellular or satellite radio telephones, or the like. Digital video devices implement video compression techniques, such as MPEG-2, MPEG-4, or H.264/MPEG-4 Advanced Video Coding (AVC), to transmit and receive digital video more efficiently.

In general, video compression techniques perform spatial prediction, motion estimation and motion compensation to reduce or remove redundancy inherent in video data. In particular, intra-coding relies on spatial prediction to reduce or remove spatial redundancy in video within a given video frame. Inter-coding relies on temporal prediction to reduce or remove temporal redundancy in video within adjacent frames. For inter-coding, a video encoder performs motion estimation to track the movement of matching video blocks between two or more adjacent frames. Motion estimation generates motion vectors, which indicate the displacement of video blocks relative to corresponding video blocks in one or more reference frames. Motion compensation uses the motion vector to generate a prediction video block from a reference frame. After motion compensation, a residual video block is formed by subtracting the prediction video block from the original video block.

A video encoder applies transform, quantization and lossless statistical coding processes to further reduce the bit rate of the residual block produced by the video coding process. Lossless statistical encoding techniques (sometimes also referred to as "entropy coding") are used in the final stages of a video encoder-decoder (CODEC), and in various other coding applications, prior to storage or transmission of the encoded data. Lossless encoding generally involves the application of codes, which may be fixed-length codes, variable length codes (often, referred to as variable length codes or VLC), or arithmetic codes to further compress residual coefficients produced by the transform and quantization operations. Examples of lossless coding techniques include context-adaptive binary arithmetic coding (CABAC) and context-adaptive variable length coding (CAVLC), which may be used as alternative lossless coding modes in some encoders. A video decoder performs lossless decoding to decompress residual information for each of the blocks, and reconstructs the encoded video using motion information and the residual information.

SUMMARY

In general, this disclosure describes techniques for coding data using one-to-one codes. These techniques may be employed during lossless statistical coding, which is commonly referred to as "entropy coding," to improve coding efficiency. By using one-to-one codes as described in this disclosure, the techniques may permit more efficient coding of data when compared to conventional use of prefix codes to entropy code similar forms of data. This improvement in coding efficiency may result because the one-to-one codes produced according to the techniques of this disclosure do not include a prefix used to define the start of so-called prefix codes. In this manner, the total size of each one-to-one code produced using the one-to-one coding techniques of this disclosure is reduced in comparison to the codewords produced using conventional prefix coding techniques.

In one aspect, a method of encoding data defining a sequence comprises computing, with an apparatus, an index representative of the sequence using a combinatorial enumeration process, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities and storing, with the apparatus, the computed index as a one-to-one code representative of the sequence.

In another aspect, an apparatus for encoding data defining a sequence comprises means for computing an index representative of the sequence using a combinatorial enumeration process, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities and means for storing the computed index as a one-to-one code representative of the sequence.

In another aspect, an apparatus for encoding data defining a sequence comprises a processing computes an index representative of the sequence using a combinatorial enumeration process, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities and a storage unit that stores the computed index as a one-to-one code representative of the sequence.

In another aspect, a non-transitory computer-readable medium storing instructions for encoding data that defines a sequence, the instructions, when executed, cause the one or more processors to compute an index representative of the sequence using a combinatorial enumeration process, wherein the index identifies the sequence in an array of all possible sequences ordered according to a probability that each of the possible sequences are output from a memoryless source, and wherein the combinatorial enumeration process reorders sequences from the memoryless source according to the corresponding probability that each of the possible sequences are output from the memoryless source and store the computed index as a one-to-one code representative of the sequence.

In another aspect, a method of decoding an index that represents a coded sequence as a one-to-one code comprises decoding, with an apparatus, the index using a combinatorial enumeration process to generate a sequence, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities and storing the sequence.

In another aspect, an apparatus of decoding an index that represents a coded sequence as a one-to-one code comprises means for decoding the index using a combinatorial enumeration process to generate a sequence, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities and means for storing the sequence.

In another aspect, an apparatus for decoding an index that represents a coded sequence as a one-to-one code comprises a processing unit that decodes the index using a combinatorial enumeration process to generate a sequence, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities and a storage unit that stores the sequence.

In another aspect, a non-transitory computer-readable medium comprising instructions for decoding an index that represents a coded sequence as a one-to-one code, the instructions, when executed, cause one or more processors to decode, with an apparatus, the index using a combinatorial enumeration process to generate a sequence, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities, and store the sequence.

The details of one or more aspects of the techniques are set forth in the accompanying drawings and the description below. Other features, objects, and advantages of the techniques will be apparent from the description and drawings, and from the claims.

DETAILED DESCRIPTION

In general, techniques are described for coding data using one-to-one codes. These techniques may be employed during lossless statistical coding, which is commonly referred to as "entropy coding," to improve coding efficiency. Using one-to-one codes in the manner described in this disclosure, the techniques may permit more efficient coding of data when compared to conventional use of prefix codes to entropy code similar forms of data. This improvement in coding efficiency may result because the one-to-one codes produced according to the techniques of this disclosure do not include a prefix used to define the start of so-called prefix codes. In this manner, the total size of each one-to-one code produced using the one-to-one coding techniques of this disclosure is reduced in comparison to the codewords produced using conventional prefix coding techniques.

The one-to-one coding techniques described in this disclosure leverage existing block start identifiers, i.e., block start identifiers that are already provided to identify the beginning (i.e., start) and end of one or more coded blocks of data within a coded bit stream. For example, a coded bit stream encoded in accordance with image or video coding algorithms, such as the so-called "JPEG" standard set forth by the Joint Photographic Experts Group (JPEG), and the MPEG-1, -2, -4 standards set forth by the Motion Pictures Experts Group (MPEG), including the joint video coding standard referred to as H.264/MPEG-4 set forth jointly by the International Telecommunication Union-Telecommunication (ITU-T) standardization sector and MPEG, employ special start codes to mark beginnings of frames, slices, groups of blocks, blocks, and the like, all of which may be considered as one or more blocks of data in this disclosure. Given these start codes, a decoder may determine the starts and ends of the one or more coded blocks of data, and thereby derive the total lengths of these one or more coded blocks of data. Consequently, the use of prefixes to define the starts of each of the one or more coded blocks of data is redundant when the coded bit stream also defines the starts and ends of these one or more coded blocks of data and one-to-one codes may be used to eliminate this redundancy and improve coding efficiency.

Figure 1:
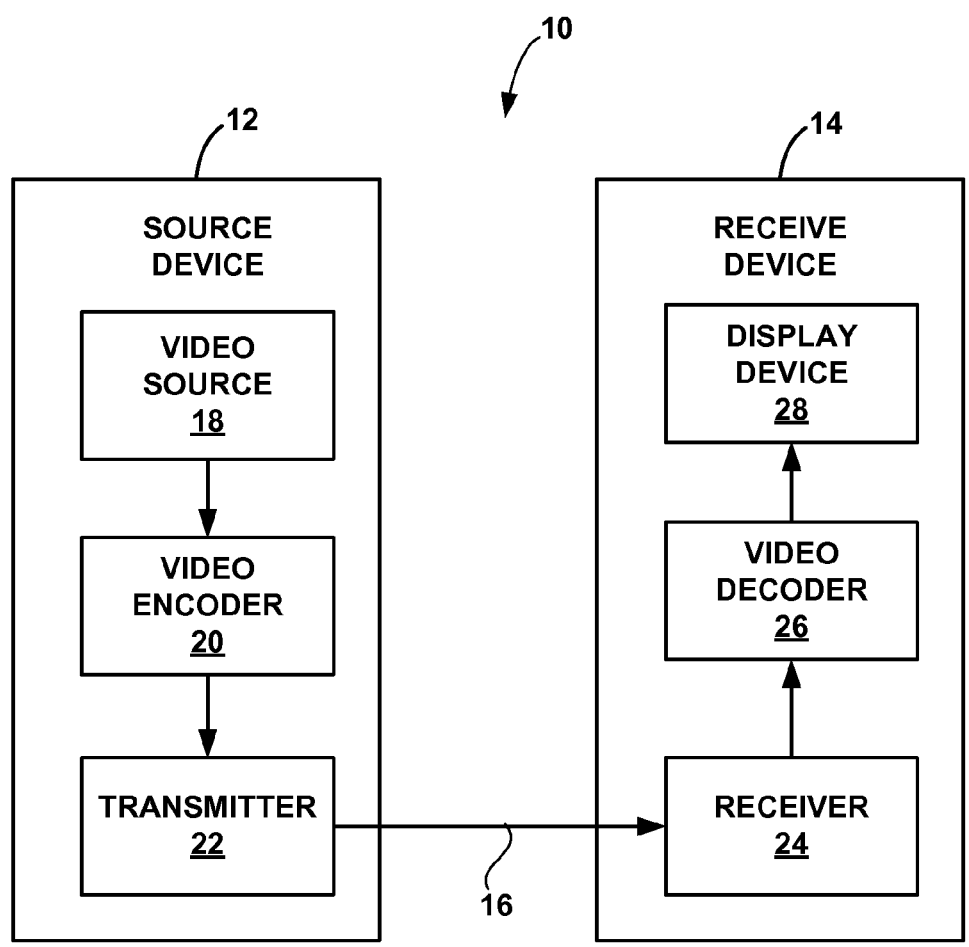
FIG. 1 is a block diagram illustrating a video encoding and decoding system.

FIG. 1 is a block diagram illustrating a video encoding and decoding system 10. As shown in FIG. 1, system 10 includes a source device 12 that transmits encoded video to a receive device 14 via a communication channel 16. Source device 12 may include a video source 18, video encoder 20 and a transmitter 22. Destination device 14 may include a receiver 24, video decoder 26 and video display device 28. System 10 may be configured to apply a generalized form of Golomb coding techniques described in this disclosure to promote more efficient coding of data that promotes reduced implementation complexity and power conservation.

In the example of FIG. 1, communication channel 16 may comprise any wireless or wired communication medium, such as a radio frequency (RF) spectrum or one or more physical transmission lines, or any combination of wireless and wired media. Channel 16 may form part of a packet-based network, such as a local area network, wide-area network, or a global network such as the Internet. Communication channel 16 generally represents any suitable communication medium, or collection of different communication media, for transmitting video data from source device 12 to receive device 14. Source device 12 and receive device 14 may each represent a fixed or mobile device, such as a computer, a workstation, a laptop, a mobile phone, a media player, a set-top box and the like.

Source device 12 generates video for transmission to destination device 14. In some cases, however, devices 12, 14 may operate in a substantially symmetrical manner. For example, each of devices 12, 14 may include video encoding and decoding components. Hence, system 10 may support one-way or two-way video transmission between video devices 12, 14, e.g., for video streaming, video broadcasting, or video telephony. For other data compression and coding applications, devices 12, 14 could be configured to send and receive, or exchange, other types of data, such as image, speech or audio data, or combinations of two or more of video, image, speech and audio data. Accordingly, discussion of video applications is provided for purposes of illustration and should not be considered limiting of the various aspects of the disclosure as broadly described herein.

Video source 18 may include a video capture device, such as one or more video cameras, a video archive containing previously captured video, or a live video feed from a video content provider. As a further alternative, video source 18 may generate computer graphics-based data as the source video (e.g., for gaming or virtual reality), or a combination of live video and computer-generated video. In some cases, if video source 18 is a camera, source device 12 and receive device 14 may form so-called camera phones or video phones. Hence, in some aspects, source device 12, receive device 14 or both may form a wireless communication device handset, such as a mobile telephone. In each case, the captured, pre-captured or computer-generated video may be encoded by video encoder 20 for transmission from video source device 12 to video decoder 26 of video receive device 14 via transmitter 22, channel 16 and receiver 24. Display device 28 may include any of a variety of display devices such as a liquid crystal display (LCD), plasma display or organic light emitting diode (OLED) display.

Video encoder 20 and video decoder 26 may be configured to support scalable video coding for spatial, temporal and/or signal-to-noise ratio (SNR) scalability. In some aspects, video encoder 20 and video decoder 22 may be configured to support fine granularity SNR scalability (FGS) coding. Encoder 20 and decoder 26 may support various degrees of scalability by supporting encoding, transmission and decoding of a base layer and one or more scalable enhancement layers. For scalable video coding, a base layer carries video data with a minimum level of quality. One or more enhancement layers carry additional bit stream to support higher spatial, temporal and/or SNR levels.

Video encoder 20 and video decoder 26 may operate according to a video compression standard, such as MPEG-2, MPEG-4, ITU-T H.263, ITU-T H.264/MPEG-4 Advanced Video Coding (AVC), or a revised standard proposed by the Joint Collaborative Team-Video Coding (JCT-VC), which is a collaboration between MPEG and ITU-T, that may be referred to as High Efficiency Video Coding (HEVC). Although not shown in FIG. 1, video encoder 20 and video decoder 26 each may be implemented as one or more processors, digital signal processors (DSPs), application specific integrated circuits (ASICs), field programmable gate arrays (FPGAs), discrete logic, software, hardware, firmware or any combinations thereof. Hence, each of video encoder 20 and video decoder 26 may be implemented as least partially as an integrated circuit (IC) chip or device, and included in one or more encoders or decoders, either of which may be integrated as part of a combined encoder/decoder (CODEC) in a respective mobile device, subscriber device, broadcast device, server, or the like. In addition, source device 12 and receive device 14 each may include appropriate modulation, demodulation, frequency conversion, filtering, and amplifier components for transmission and reception of encoded video, as applicable, including radio frequency (RF) wireless components and antennas sufficient to support wireless communication. For ease of illustration, however, such components are not shown in FIG. 1.

A video sequence includes a series of video frames. Video encoder 20 operates on blocks of pixels within individual video frames in order to encode the video data. The video blocks may have fixed or varying sizes, and may differ in size according to a specified coding standard. Each video frame includes a series of slices. Each slice may include a series of macroblocks, which may be arranged into sub-blocks. As an example, the ITU-T H.264 standard supports intra prediction in various block sizes, such as 16 by 16, 8 by 8, 4 by 4 for luma components, and 8×8 for chroma components, as well as inter prediction in various block sizes, such as 16 by 16, 16 by 8, 8 by 16, 8 by 8, 8 by 4, 4 by 8 and 4 by 4 for luma components and corresponding scaled sizes for chroma components.

Smaller video blocks can provide better resolution, and may be used for locations of a video frame that include higher levels of detail. In general, macroblocks (MBs) and the various sub-blocks may be considered, in general, to represent video blocks. In addition, a slice may be considered to represent a series of video blocks, such as MBs and/or sub-blocks. Each slice may be an independently decodable unit. After prediction, a transform may be performed on the 8×8 residual block or 4×4 residual block, and an additional transform may be applied to the DCT coefficients of the 4×4 blocks for chroma components or luma component if the intra_16×16 prediction mode is used.

Video encoder 20 and/or video decoder 26 of system 10 of FIG. 1 may be configured to employ the coding techniques described in this disclosure. In particular, video encoder 20 and/or video decoder 26 may each include a lossless statistical coding unit, which is commonly referred to as an "entropy coding unit" (which itself may be referred to as an entropy encoder) and "an entropy decoding unit" (which itself may be referred to as an entropy decoder), respectively, that implements at least some of such techniques to promote more efficient coding of image or video data. Although described with respect to image and video data, the techniques may be employed by any encoder and/or decoder that codes data having start and/or end codes to identify the start of one or more blocks of the data.

To implement these coding techniques, a coding device, such as video encoder 20 and more particularly the entropy encoder of video encoder 20, first receives data defining sets of values. The sets of values in this instance may refer to any type of data, including data corresponding to the wide variety of applications described above, such as digital video, image, audio or speech data, or other data. With respect to digital video data, a set of values may, as one example, refer to quantized data indicative of transform coefficients in one or more residual blocks. For example, the sets of values may be indicative of Discrete Cosine Transform (DCT) coefficients of one or more residual blocks. Generally, these one or more residual blocks may represent a single block or residual block, a group of blocks or residual blocks, a slice, a frame, a group of pictures, or any other conceivable segmentation unit of video data or image data. In other examples, the sets of data may be indicative of any other suitable video data such as video syntactic elements. Regardless of the data, the techniques apply to any type of data that is segmented into one or more blocks of data and such segmentation is denoted by what is referred to as a "start code."

Start codes in the disclosure refer to any code or identifier used to denote the start of one or more blocks of the data. Considering video data for illustrative purposes, the H.264/MPEG-4 video coding standard (which may also be commonly referred to as the "H.264 video coding standard" or "H.264") provides for a bit stream format that includes start codes in Annex B of the ITU-T H.264 recommendation, entitled "Series H: Audiovisual and Multimedia Systems, Infrastructure of Audiovisual Services—Coding of Moving Video: Advanced Video Coding for Generic Audiovisual Services." This bit stream format consists of a sequence of bit stream network abstraction layer (NAL) unit syntax structures, where each bit stream NAL unit syntax structure contains one start code prefix followed by one NAL unit syntax structure. The NAL unit syntax structure includes a NAL unit and one or more zero-valued bytes. The entropy encoder of video encoder 20 generally receives and subsequently encodes the one or more blocks or residual blocks forming a NAL unit, which is subsequently encapsulated by a start code to form of bit stream NAL unit syntax structure.

Rather than employ prefix codes, such as variable length codes, the entropy encoder performs the one-to-one coding techniques described in this disclosure to code the one or more blocks or residual blocks of the NAL unit. One-to-one codes comprise codes that do not satisfy the so-called prefix property. The prefix property refers to a property of the construction of prefix codes where none of the prefix codes is a prefix to any other prefix code. Consequently, one-to-one codes may be a prefix to one or more other one-to-one codes. Generally, when a code does not satisfy the prefix property, the decoder has difficulty parsing the code words for that code as there is no clear indication of the start of a given code word. In this instance, however, the start code for the bit stream NAL unit syntax structure indicates the start of each one-to-one code word and codes that do not satisfy the prefix property may be employed.

To determine the one-to-one code word for the given one or more blocks that form the NAL unit, the entropy encoder of video encoder 20 first computes an index representative of the one or more blocks using a combinatorial enumeration process. In a binary implementation of video encoder 20, binary sequences are used to define the one or more blocks forming the NAL unit. Consequently, the one or more blocks are defined using a binary sequence and the one or more blocks may be considered to generally represent one example of a binary sequence to which the techniques of this disclosure may be applied. In any event, the index identifies the binary sequence represented in this example by the one or more blocks in an array of all possible binary sequences ordered according to a probability that each of the possible binary sequences are output form a memoryless source.

A memoryless source is typically defined, in information theory, as a source of symbols for which the probability of outputting a given symbol does not depend on any of the previously output symbols. In other words, the symbols output of this source are independent from any previous or successively output symbols and, therefore, these symbols may be described as an independent, identically-distributed random variable. With respect to the example of FIG. 1, the entropy encoder of video encoder 20 is configured to assume that each of the one or more blocks of, again, in this example residual data or DCT coefficients that form a NAL unit has the same probability distribution as all of the other one or more blocks forming a NAL unit that this entropy encoder receives and that all of the one or more blocks forming a NAL unit are mutually independent. This assumption may reduce the complexity of the implementation of entropy encoder 20 while not substantially impacting its ability to effectively perform lossless coding using the one-to-one coding techniques described in this disclosure.

The combinatorial enumeration process refers to a process of reordering binary sequences from such a memoryless source according to the corresponding probability that each of the possible binary sequences is output from the memoryless source. Generally, the probability that each of the possible binary sequences is output from the memoryless source is a function of the number of ones used to define each of the possible binary sequences. Thus, for each of the possible binary sequences that have the same number of ones, the probabilities that each of these possible binary sequences is output from the memoryless source are the same. For example, given a 2-bit binary sequence, the possible binary sequences are 00, 01, 10 and 11. For 2-bit binary sequences 01 and 10, which both have the same number of ones, the probability that the memoryless source outputs these two sequences is the same. In this respect, the combinatorial enumeration aspects of the one-to-one coding techniques classify all possible binary sequences output from the assumed memoryless source into different groups of binary sequences that have the same probability of being output by the memoryless source, which as noted above is a function of the number of ones in the possible binary sequences.

Generally, the entropy encoder first determines the number of ones in the received binary sequence and then performs a multiset coefficient operation to determine an offset identifying one of these groups. Computing the multiset coefficient generally involves iteratively computing the binomial coefficient of the total number of bits used to define the binary sequence choose 0, . . . , the determined total number of ones minus one and adding the result of each of these computed binomial coefficients together. After identifying the group with the offset, the entropy encoder then lexicographically arranges the binary sequences within each group to determine what may be referred to as a "local index" of the binary sequence within the group. The entropy encoder then computes the index by adding the offset to the local index. The entropy encoder then codes this index using a one-to-one code.

Referring again to the 2-bit binary sequence example above, both 01 and 10 have the same probability and, in this example, the multiset coefficient computes the offset for these two binary sequences as two (the total number of bits defining the binary sequence) choose zero (i.e., the determined number of ones in each of these binary sequences or one minus one equals zero), which equals one. The entropy encoder therefore determines this offset as one. In the identified group, the two binary sequences can be lexicographically arranged as 01 and 10 and then assigned a local index of one and two, respectively. Upon receiving the 2-bit binary sequence 01, the entropy encoder computes the offset of one and the local index of one and adds these two together to produce an index of two. The entropy encoder of video encoder 20 then performs one-to-one coding techniques to encode this index as the binary representation of two or $10_2$.

In this respect, the techniques may reduce redundancy and thereby more efficiently compress data. By leveraging start codes used in bit stream NAL syntax structures to signal the start of a NAL unit, the techniques may avoid having to rely on prefix codes (which effectively include another start code to signal the start of the code word) when coding this sort of start code segmented data. Rather than searching for a prefix code to identify the start of a codeword, a decoder can use the start code that has already been provided in the NAL unit pursuant to the video coding standard, e.g., H.264. Consequently, the prefix code can be eliminated for some or all of the codewords, thereby substantially reducing the number of bits needed to convey the codewords in the bit stream. Once the prefix property is removed as a requirement, the techniques enable consideration of other types of codes, including the efficient one-to-one codes described above. One-to-one codes do not adhere to the prefix property and, as a result, are able to more efficiently represent a given binary sequence when compared to variable length or other prefix codes. As a result, utilization of the one-to-one coding techniques may significantly improve compression efficiency over conventional coding techniques.

Video decoder 26 implements an inverse process to that described above with respect to video encoder 20. Video decoder 26 is able to parse the entropy encoded NAL units from the bit stream NAL syntax structure using the start codes. Each entropy encoded NAL unit in a receive buffer of video decoder 26 is aligned such that a start code for one entropy encoded NAL unit acts as an end code for the immediately preceding entropy encoded NAL unit in the receive buffer. That is, start codes bound a given entropy encoded NAL unit in the receive buffer, enabling the end of any given entropy encoded NAL unit to be derived from the successive start code. Consequently, video decoder 26 is able to parse an entropy encoded NAL unit from the buffer and pass this entropy encoded NAL unit to the entropy decoder of video decoder 26. Entropy decoder 26 then performs a process inverse to that described above to reconstruct the NAL unit, which is then used by the remaining portions of video decoder 26 to reproduce the originally captured video data via display device 26.

Figure 2:
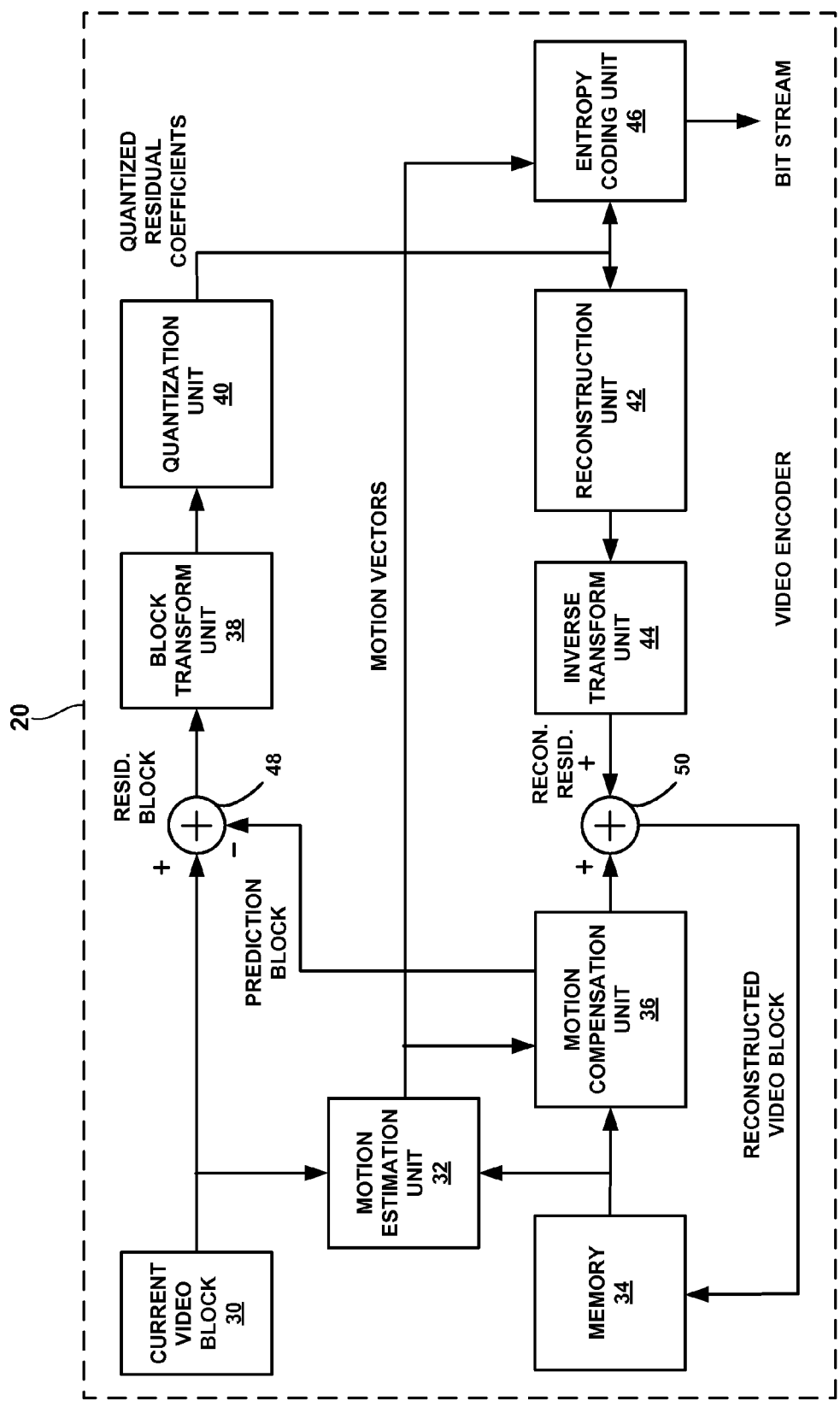
FIG. 2 is a block diagram illustrating an example of a video encoder as shown in FIG. 1.

FIG. 2 is a block diagram illustrating an example of a video encoder 20 as shown in FIG. 1. Video encoder 20 may be formed at least in part as one or more integrated circuit devices, which may be referred to collectively as an integrated circuit device. In some aspects, video encoder 20 may form part of a wireless communication device handset or broadcast server. Video encoder 20 may perform intra- and inter-coding of blocks within video frames. Intra-coding relies on spatial prediction to reduce or remove spatial redundancy in video within a given video frame. Inter-coding relies on temporal prediction to reduce or remove temporal redundancy in video within adjacent frames of a video sequence. For inter-coding, video encoder 20 performs motion estimation to track the movement of matching video blocks between adjacent frames.

As shown in FIG. 2, video encoder 20 receives a current video block 30 within a video frame to be encoded. In the example of FIG. 2, video encoder 20 includes motion estimation unit 32, memory 34, motion compensation unit 36, block transform unit 38, quantization unit 40, inverse quantization unit 42, inverse transform unit 44 and entropy coding unit 46. An in-loop or post loop deblocking filter (not shown) may be applied to filter blocks to remove blocking artifacts. Video encoder 20 also includes summer 48 and summer 50. FIG. 2 illustrates the temporal prediction components of video encoder 20 for inter-coding of video blocks. Although not shown in FIG. 2 for ease of illustration, video encoder 20 also may include spatial prediction components for intra-coding of some video blocks.

Motion estimation unit 32 compares video block 30 to blocks in one or more adjacent video frames to generate one or more motion vectors. The adjacent frame or frames may be retrieved from memory 34, which may represent any type of memory or data storage device to store video blocks reconstructed from previously encoded blocks. Motion estimation may be performed for blocks of variable sizes, e.g., 16×16, 16×8, 8×16, 8×8 or smaller block sizes. Motion estimation unit 32 identifies one or more blocks in adjacent frames that most closely matches the current video block 30, e.g., based on a rate distortion model, and determines displacement between the blocks in adjacent frames and the current video block. On this basis, motion estimation unit 32 produces one or more motion vectors (MV) that indicate the magnitude and trajectory of the displacement between current video block 30 and one or more matching blocks from the reference frames used to code current video block 30.

Motion vectors may have half- or quarter-pixel precision, or even finer precision, allowing video encoder 20 to track motion with higher precision than integer pixel locations and obtain a better prediction block. When motion vectors with fractional pixel values are used, interpolation operations are carried out in motion compensation unit 36. Motion estimation unit 32 identifies the best block partitions and motion vector or motion vectors for a video block using certain criteria, such as a rate-distortion model. For example, there may be more than one motion vector in the case of bi-directional prediction. Using the resulting block partitions and motion vectors, motion compensation unit 36 forms a prediction video block.

Video encoder 20 then forms a residual video block by subtracting the prediction video block produced by motion compensation unit 36 from the original, current video block 30 at summer 48. Block transform unit 38 applies a transform, such as the 4×4 or 8×8 integer transform used in H.264/AVC, to the residual block, producing residual transform block coefficients.

Quantization unit 40 quantizes (e.g., rounds) the residual transform block coefficients to further reduce bit rate. Quantization unit 40 may also perform the reordering mentioned above whereby quantization unit 40 may reorder various portions of the residual transform block coefficients. For example, the transform coefficients may comprise DCT coefficients that include at least one DC coefficient and one or more AC coefficients. Quantization unit 40 may group DC coefficients from one or more residual transform block coefficients to form a single sample and group the one or more AC coefficients from one or more residual transform block coefficients to form one or more samples. Thus, quantization unit 40 may reorder the DCT coefficients to form samples that comprise only DC coefficients from one or more blocks and AC coefficients from one or more blocks.

Entropy coding unit 46 entropy codes the quantized coefficients to even further reduce bit rate. Entropy coding unit 46 may code the quantized block coefficients in accordance with the coding techniques described in this disclosure. Hence, the various encoding processes described in this disclosure may be implemented within entropy coding unit 46 to perform coding of video data. Alternatively, such an entropy coding unit 46 may perform the processes described in this disclosure to code any of a variety of data, including but not limited to video, image, speech and audio data. In general, video decoder 26 performs inverse operations to decode and reconstruct the encoded video, as will be described, e.g., with reference to FIG. 4.

Reconstruction unit 42 and inverse transform unit 44 reconstruct quantized coefficients and apply inverse transformation, respectively, to reconstruct the residual block. Summation unit 50 adds the reconstructed residual block to the motion compensated prediction block produced by motion compensation unit 36 to produce a reconstructed video block for storage in memory 34. The reconstructed video block is used by motion estimation unit 32 and motion compensation unit 36 to encode a block in a subsequent video frame.

Figure 3:
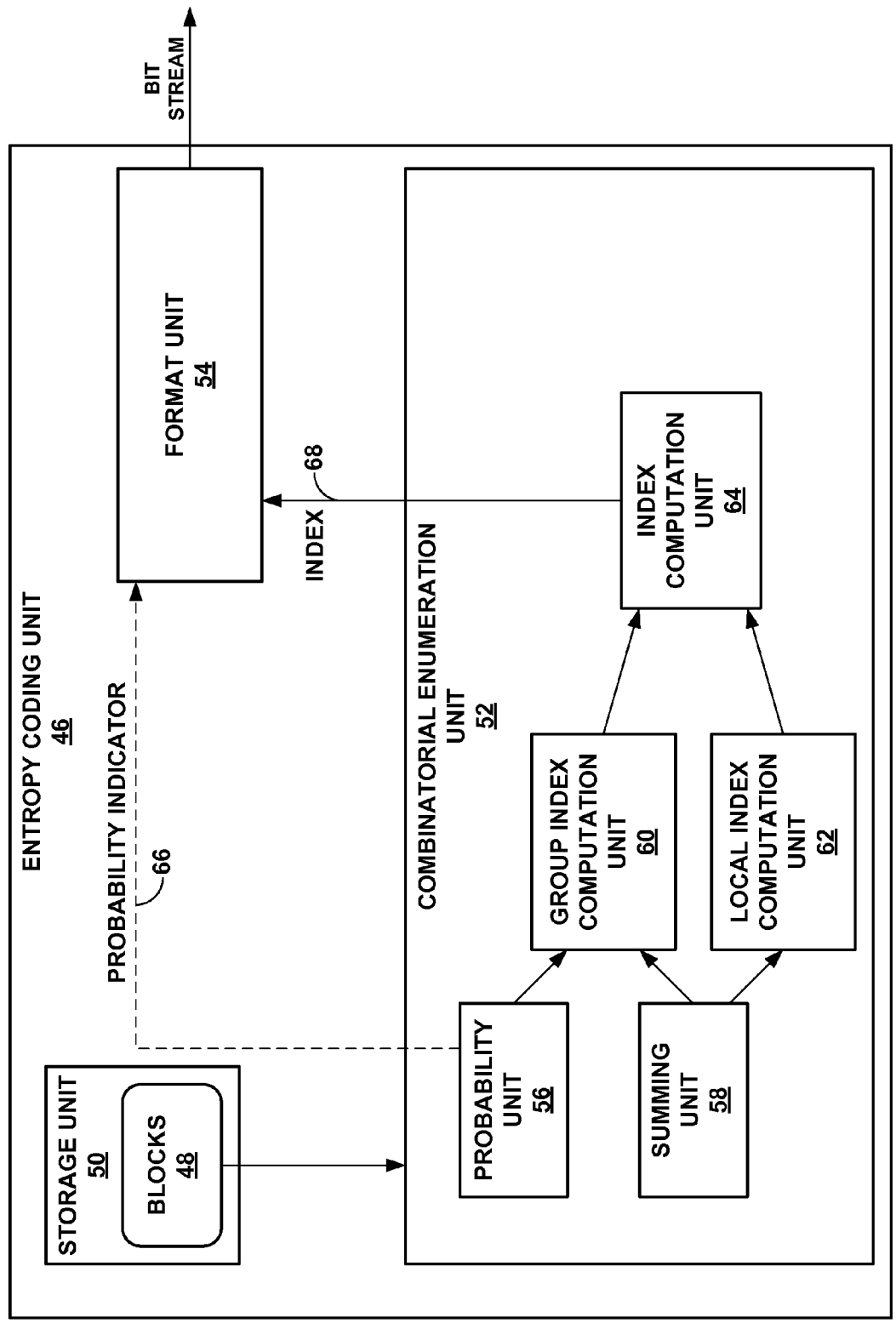
FIG. 3 is a block diagram illustrating an example of an entropy coding unit suitable for use in the encoder of FIG. 2.

FIG. 3 is a block diagram illustrating an example of a lossless coding unit, such as entropy coding unit 46 of FIG. 2, in more detail. As shown in FIG. 3, entropy coding unit 46 receives data defining one or more blocks 48 to be encoded. Again, in some examples, the blocks may be blocks of quantized transform coefficients. In the example of FIG. 3, entropy coding unit 46 includes a storage unit 50, a combinatorial enumeration unit 52 and a format unit 54. Although not shown in FIG. 3, entropy coding unit 46 may include other modules for encoding the other information described above, such as a motion vector coding unit. The techniques therefore should not be limited to the example entropy coding unit 46 shown in FIG. 3.

Entropy coding unit 46 receives blocks 48, which as described above may comprise blocks of quantized DCT coefficients, and stores blocks 48 to storage unit 50. Entropy coding unit 46. Storage unit 50 may comprise a computer-readable storage medium, such as a random access memory (RAM), synchronous dynamic random access memory (SDRAM), read-only memory (ROM), non-volatile random access memory (NVRAM), electrically erasable programmable read-only memory (EEPROM), FLASH memory, magnetic or optical data storage media, any other type of memory or storage device capable of storing blocks 48, or any combination of the foregoing memories or storage devices. While described as residing internally to entropy coding unit 46, storage unit 50 may reside externally from entropy coding unit 46, with entropy coding unit 46 accessing storage unit 50 to retrieve blocks 48.

Combinatorial enumeration unit 52 includes a number of units 56-64 that implement the combinatorial enumeration aspects of the techniques described in this disclosure. As shown in the example of FIG. 3, combinatorial enumeration unit 52 includes a probability unit 56, a summing unit 58, an group index computation unit 62, a local index computation unit 62 and an index computation unit 64. Probability unit 56 represents a unit that estimates or otherwise determines the probability with which the assumed memoryless source outputs a one or a zero. Probability unit 56 may estimate this probability by, for example, comparing the number of ones in the binary data used to define blocks 48. To illustrate, consider that blocks 48 are defined using 16 bits and that these 16 bits are 1000 0110 0000 0010. In this example, there are four ones and 10 zeros. Probability unit 56 may estimate the probability that the memoryless source outputs a one as four divided by 16 for an estimate probability of twenty five percent.

In some instances, probability unit 56 determines this probability over a number of different blocks 48 that represent a slice or other segmentation of a video frame. That is, entropy coding unit 46 may receive a first set of blocks 48, where probability unit 56 estimates this probability for this first set of blocks 48. Entropy coding unit 46 may then receive a second set of blocks 48 and probability unit 56 may estimate the probability with which the memoryless source outputs a one in the manner described above, only that it keeps a current count of the ones and the total number of bits and updates this current count of ones and the total number of bits to reflect the addition of the second set of blocks 48.

For example, the binary bits defining the second set of blocks may be 1111 0000 1100 0101 and probability unit 56 may determine the estimate of the probability with which the memoryless source outputs a one as 12 (four ones in first set of blocks 48 plus the eight ones in second set of blocks 48)/32 (the 16 total bits to define first set of blocks 48 plus the 16 total bits to define second set of blocks 48) rather than eight divided by 16, as would be the case had probability unit 56 not kept a running tally of ones and the total number of bits. Alternatively, probability unit 56 may estimate the probability for each set of blocks 48 individually without keeping a running tally. Moreover, the techniques should not be limited to any one way of estimating or otherwise determining this probability. Probability unit 56 may forward this determined probability or an indication thereof to both format unit 54 and group index computation unit 60, where the probability indication is shown in the example of FIG. 3 as probability indicator 66.

Summing unit 58 represents a unit that sums the binary ones of the binary bits used to define blocks 48 in order to determine the total number of ones in the binary sequence that defines blocks 48. Referring back to the example binary sequence of 1000 0110 0000 0010 considered above, summation unit 58 determines that there are four ones in this binary sequence and outputs this total number of ones to both group index computation unit 60 and local index computation unit 62. Group index computation unit 60 represents a unit that computes a group index for the binary sequence represented in this example as blocks 48 based on the determined number of ones, and in some instances, the probability indication. This group index identifies a position of the binary sequence relative to those of the possible binary sequences that have a same probability as that of the binary sequence represented as blocks 48 in the example of FIG. 3.

Local index computation unit 62 computes a local index for the binary sequence represented as blocks 48 to uniquely identify the binary sequence defining blocks 48 within those of the possible binary sequences that have the same probability as that of the binary sequence defining blocks 48. Local index computation unit 62 may effectively perform a form of lexicographical arranging to arrange those of the possible binary sequences that have the same probability as that of the binary sequence defining blocks 48 in the manner described above and assign an index to each of the possible sequences in the lexicographic arrangement.

To illustrate, local index computation unit 62 may arrange binary sequences 1000, 0100, 0010 and 0001 (which represent all possible four bit sequences that have the same probability as will be shown below in more detail) lexicographically as 0001, 0010, 0100 and 1000 and assign a local index of zero to 0001, a local index of one to 0010, a local index of two to 0100 and a local index of three to 1000. Given a binary sequence of 0010, local index computation unit 62 may compute a local index of two for this binary sequence. Generally, local index computation unit 62 computes this local index in accordance with various mathematical equations and does not literally arrange all of the possible sequences in this lexicographical order as actually storing tables to define the relationship between the possible sequences and the index consumes significant amount of memory, especially when the number of bits in a binary sequence reaches large numbers, e.g., 128 bits, 256 bits or larger. Index computation unit 64 represents a unit that computes index 68 based on the computed group index and the computed local index. Generally, index computation unit 64 adds the computed group index to the computed local index to provide index 68.

Format unit 58 represents a unit that formats index 68 and probability indicator 68 to form the bit stream. As noted above, this bit stream typically includes a number of start codes and a number of NAL units, where each of the start codes identifies the start of a corresponding one of the NAL units. The NAL units may include a header or other information and format unit 54 may update this header to signal the probability indicator 66 and then store the index 68 as a one-to-one code to the one of the NAL units' payload. Format unit 54 then outputs bit stream for transmission to a video decoder, such as video decoder 26 shown in more detail below with respect to FIGS. 4 and 5.

Figure 4:
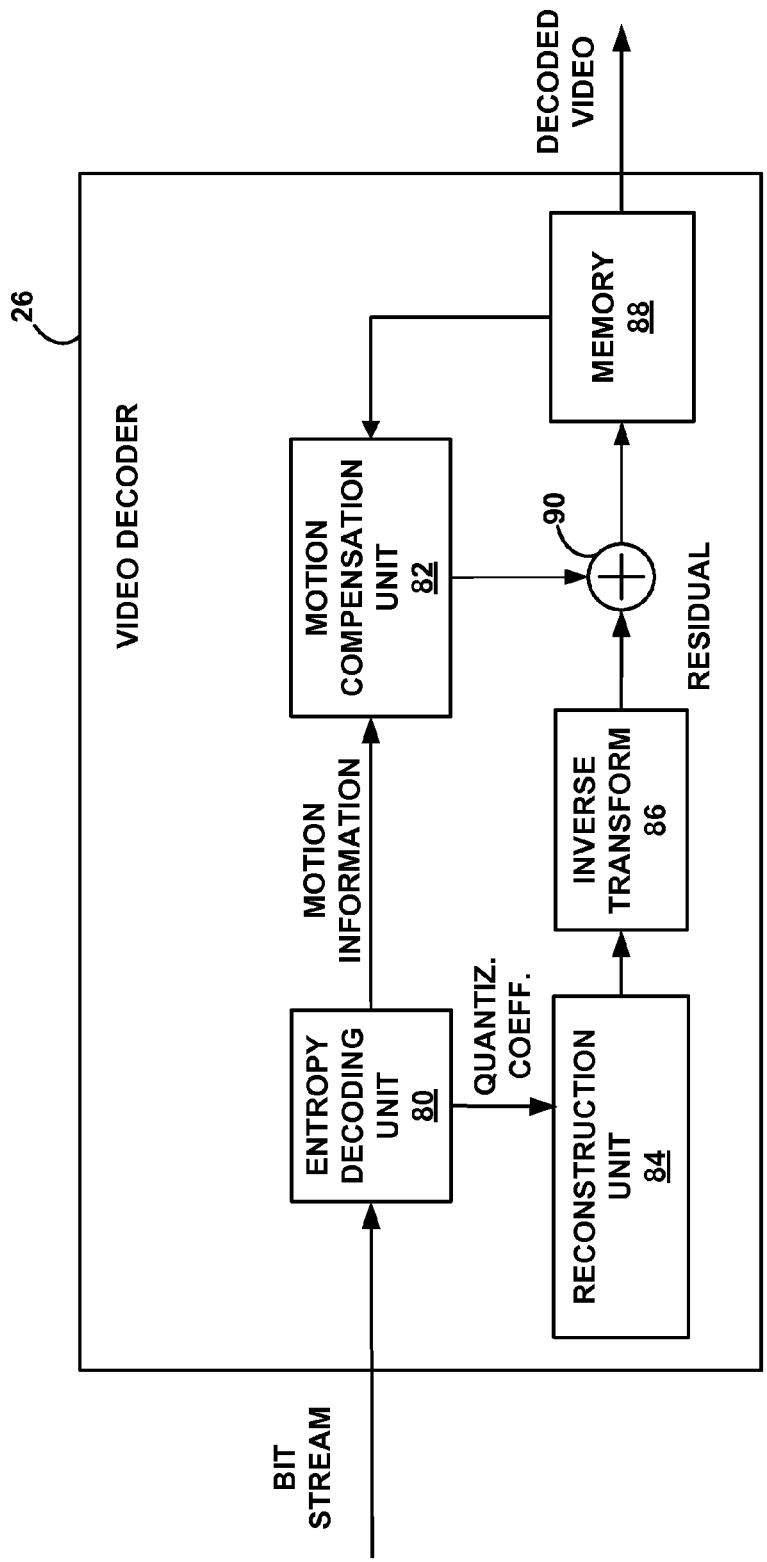
FIG. 4 is a block diagram illustrating an example of the video decoder of FIG. 1.

FIG. 4 is a block diagram illustrating an example of video decoder 26 of FIG. 1. Video decoder 26 may be formed at least in part as one or more integrated circuit devices, which may be referred to collectively as an integrated circuit device.

In some aspects, video decoder 26 may form part of a wireless communication device handset. Video decoder 26 may perform intra- and inter-decoding of blocks within video frames. As shown in FIG. 1, video decoder 26 receives an encoded video bit stream that has been encoded by video encoder 20. In the example of FIG. 4 video decoder 26 includes entropy decoding unit 80, motion compensation unit 82, reconstruction unit 84, inverse transform unit 86, and memory 88. Video decoder 26 also may include an in-loop deblocking filter (not shown) that filters the output of summer 90. Video decoder 26 also includes summer 90. FIG. 4 illustrates the temporal prediction components of video decoder 26 for inter-decoding of video blocks. Although not shown in FIG. 4, video decoder 26 also may include spatial prediction components for intra-decoding of some video blocks.

Entropy decoding unit 64 receives the encoded video bit stream and decodes from the bit stream quantized residual coefficients and quantized parameters, as well as other information, such as macroblock coding mode and motion information, which may include motion vectors and block partitions. For example, in order to decode the encoded binary sequence defining one or more blocks stored as one or more NAL units in the bit stream, entropy decoding unit 80 of FIG. 4 may perform the inverse of the coding techniques described with respect to entropy coding unit 46 of FIG. 3 in order to retrieve the encoded binary sequence from the bit stream. Hence, the various decoding processes described in this disclosure may be implemented within entropy decoding unit 80 to perform decoding of video data. Alternatively, entropy decoding unit 80 may perform the processes described in this disclosure to decode any of a variety of data, including but not limited to video, image, speech and audio data. For example, the data being decoded may include pixel data, video format syntactic elements, or other coded video data. In either case, the result of the coding performed by entropy decoding unit 80 may be output to other modules of video decoder 26. For example, entropy decoding unit 80 may output one or more decoded blocks of quantized DCT coefficients (i.e., blocks 48 in the example of FIG. 3) to reconstruction unit 84.

Motion compensation unit 82 receives the motion vectors and block partitions and one or more reconstructed reference frames from memory 88 to produce a prediction video block. Reconstruction unit 84 inverse quantizes, i.e., de-quantizes, the quantized block coefficients. Inverse transform unit 86 applies an inverse transform, e.g., an inverse DCT or an inverse 4×4 or 8×8 integer transform, to the coefficients to produce residual blocks. The prediction video blocks are then summed by summer 90 with the residual blocks to form decoded blocks. A deblocking filter (not shown) may be applied to filter the decoded blocks to remove blocking artifacts. The filtered blocks are then placed in memory 88, which provides reference frames for decoding of subsequent video frames and also produces decoded video to drive display device 28 (FIG. 1).

Figure 5:
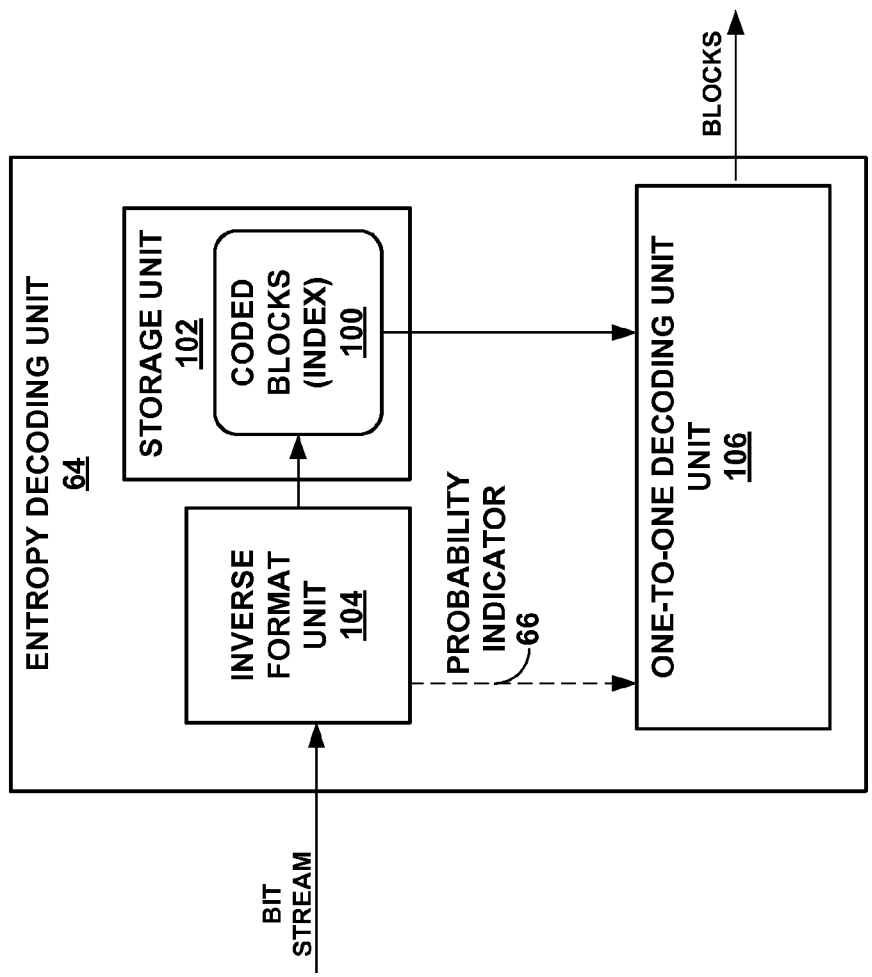
FIG. 5 is a block diagram illustrating an example of an entropy decoding unit in more detail.

FIG. 5 is a block diagram illustrating an example of a lossless decoding unit, such as entropy decoding unit 64 of FIG. 4, in more detail. As shown in the example of FIG. 5, entropy decoding unit 64 receives a bit stream that includes both probability indicator 66 and one or more one-to-one coded blocks 100. In the example of FIG. 5, entropy decoding unit 64 includes storage unit 102, an inverse format unit 104, and a one-to-one decoding unit 106, which may each or collectively be implemented as one or more hardware modules or a combination of one or more hardware and software modules. Although not shown in FIG. 5, entropy decoding unit 64 may include other modules for encoding the other information described above, such as a motion vector decoding unit. The techniques of this disclosure, therefore, should not be limited to the example of entropy decoding unit 64 shown in FIG. 5.

Inverse format unit 104 of entropy decoding unit 64 receives the bit stream comprising NAL units denoted by corresponding start codes, and extracts coded blocks 100 from a NAL unit as well as probability indicator 66. Inverse format unit 104 stores coded blocks 100 to storage unit 102. Storage unit 102 may be substantially similar to storage unit 50 in that storage unit 102 comprises a computer-readable storage medium, such as random access memory (RAM), synchronous dynamic random access memory (SDRAM), read-only memory (ROM), non-volatile random access memory (NVRAM), electrically erasable programmable read-only memory (EEPROM), FLASH memory, magnetic or optical data storage media, any other type of memory or storage device capable of storing coded sample 100, or any combination of the foregoing memories or storage devices.

While described as residing internally to entropy decoding unit 64, storage unit 102 may reside externally from entropy coding unit 64, with entropy decoding unit 64 accessing storage unit 102 to retrieve coded sample 100, which may comprise a generalized Golomb code that is coded in accordance with the coding techniques described in this disclosure. Based on, in some cases, probability indicator 66 as described in more detail below, one-to-one decoding unit 106 decodes coded blocks 100, where coded blocks 100 are coded as index 68 shown in the example of FIG. 3. Index 68 identifies a relative position with respect to all other possible binary sequences defined using the same number of bits. One-to-one decoding unit 106 uses probability indicator 66 to determine how these indexes are lexicographically assigned to all of these possible binary sequences.

As noted above, this probability indicator 66 identifies the probability with which the memoryless source outputs a one. As described below, when this probability equals or exceeds 50 percent, the ordering of the index is inversed such that the binary sequence with the most ones has the highest probability of occurrence. When this probability is less than 50 percent, the ordering of the indexes is such that the binary sequence with the least number of ones (i.e., most number of zeros) has the highest probability of occurrence. As a result, probability indicator 66 generally indicates whether the estimated probability described above is greater than or equal to 50 percent or less than 50 percent. Often, probability indicator 66 is expressed as a single bit with a one value indicating an estimated probability that is greater than or equal to 50 percent and a zero value indicating an estimated probability that is less than 50 percent. One-to-one decoding unit 106 may also receive other information to facilitate its decoding, such as the size of the one or more blocks, i.e., blocks 48 in this example, that were coded in terms of a number of bits used to define the one or more blocks. This may be signaled a single time initially by the bit stream header information or may be signaled multiple times throughout the bit stream header information (such as at each slice header). In any event, given this information, one-to-one decoding unit 106 may reconstruct blocks 48 from coded blocks 100 (which, again, represents index 68) using a procedure that is inverse, at least to some extent, to that described above with respect to entropy encoder 46 of the example of FIG. 3.

Figure 6:
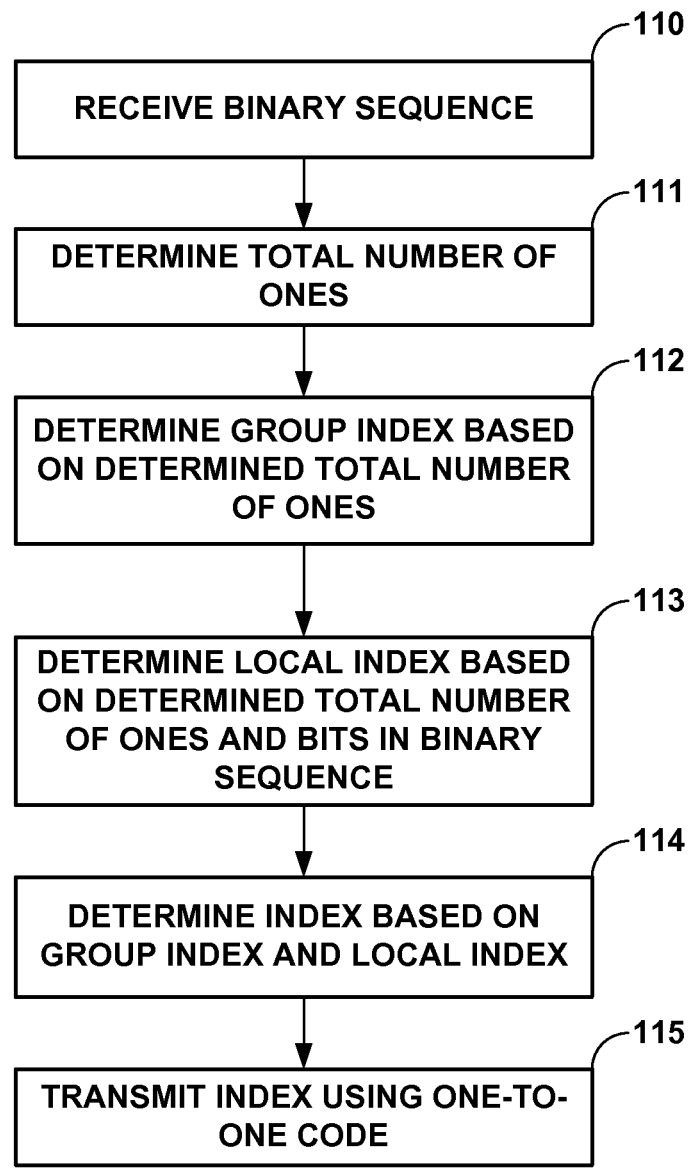
FIG. 6 is a flowchart illustrating exemplary operation of an encoding device in performing the encoding techniques described in this disclosure.

FIG. 6 is a flowchart illustrating exemplary operation of a coding device, such as entropy coding unit 46 of FIG. 3, in performing the coding techniques described in this disclosure. Initially, entropy coding unit 46 receives one or more blocks 48 comprised of a set of values, which as described above may comprise quantized DCT coefficients or any other set of values (110). Next, summing unit 58 computes the total number of ones k for the binary sequence x represented in the example of FIG. 3 as blocks 48 (111). This determination of the total number of ones k can be expressed mathematically by way of the following equation (1):

$$k = \sum_{i=1}^{n} x_i, \quad (1)$$

where k, again, denotes the total number of ones, n denotes the length of binary sequence x and $x_i$ denotes the corresponding numbered bit of the binary sequence (e.g., for the binary sequence x=01, $x_1$ is equal to 1 and $x_2$ is equal to 0).

Probability unit 56 then determines a probability with which the assumed memoryless source outputs a one for any given bit in a binary sequence in the manner described above. In some instances, probability unit 56 may know the probabilities, although this is not common, and generally probability unit 56 determines an estimate of this probability.

When probabilities are known, such probabilities can be expressed by the following equations (2) and (3):

$$Pr(0) = p; \text{ and} \quad (2)$$

$$Pr(1) = q = 1 - p. \quad (3)$$

In equation (2), Pr(0) represents probability with which the memoryless source outputs a zero and p denotes the known probability with which the memoryless source outputs a zero. In equation (3), Pr(1) represents a probability with which the memoryless source outputs a one and q denotes the known probability with which the memoryless source outputs a one. As also noted in equation (3), Pr(1) is also equal to one minus the known probability with which the memoryless source outputs a zero. While not shown in equation (2), Pr(0) may also be expressed as one minus the known probability with the memoryless source outputs a one or 1−q.

Given these known probabilities, a binary sequence denoted as "x" of length "n" that contains "k" ones (i.e., k in [0, n]), the probability with which the memoryless source outputs x can be expressed by the following equation (4):

$$Pr(x) = Pr(k) = p^k q^{n-k}. \quad (4)$$

In this equation (4), the probability with which the assumed memoryless source outputs the binary sequence x is equal to the probability with which the memoryless source outputs a binary sequence with k ones, which is equal to the known probability with which the memoryless source outputs a zero raised to the total number of ones in the binary sequence times the known probability with which the memoryless source outputs a one raised to the result of subtracting the total number of ones k in the binary sequence x from the total number of bits n used to express the binary sequence. In other words, given a memoryless source, the probability with which this source outputs any given binary sequence of length n having k ones in a function of the number of ones k, the number of bits used to express the binary sequence n and the known probability with which this source outputs a one (or a zero), considering that p and q are functions of one another.

Moreover, this probability expressed in equation (4) does not depend on the order of the bits in binary sequence x, but only on the total number of ones in the binary sequence. As a result, there will be n choose k sequences that have the same probability Pr(k), where n choose k refers to the binomial coefficient of n choose k or the total number of bits used to define the binary sequence x choose the total number of ones in the binary sequence x as expressed mathematically in the following equation (5):

$$\binom{n}{k}. \quad (5)$$

Further, when evaluating equation (4) and assuming that p is greater than q, it can be determined that Pr(k) increases with the increase of k. Further still, when evaluating equation (4) and assuming that p is less than q, it can be determined that Pr(k) decreases with the increase of k.

To illustrate the impact of these determinations derived from equation (4), consider again the following binary sequences 00, 01, 10 and 11. According to equation (4), when p is greater than q, i.e., when the probability that the memoryless source outputs a zero is greater than the probability that it outputs a one, the probability that the memoryless source outputs 00 is greatest, the probability that the memoryless source outputs 11 is the least and the probability that this source outputs either of 01 and 10 is the same and less than the probability it outputs 00 but greater than the probability it outputs the binary sequence 11. However, when q is greater than p, i.e., when the probability of the memoryless source outputs a one is greater than the probability that it outputs a zero, the probability that the memoryless source outputs 00 is least, the probability that the memoryless source outputs 11 is the greatest, and the probability that this source outputs either of 01 and 10 is the same and greater than the probability it outputs 00 but less than the probability it outputs the binary sequence 11. In this way, a relative ordering of the binary sequences for a given length n may be ordered into what may be characterized as groups depending on the total number of ones (which again is denoted as the variable "k") in any given binary sequence of length n.

Group index computation unit 60 of combinatorial enumeration unit 52 included within entropy coding unit 46 implements this aspect of the techniques to identify a group index based on probability indicator 66 and the total number of ones k calculated by summing unit 58.

Group index computation unit 60 determines then determines the group index based on probability indicator 66 and the determined total number of ones (112). This determination may be expressed mathematically according to the following equation (6).

$$\text{group\_index}(k) = \begin{cases} \sum_{i=0}^{k-1} \binom{n}{i} & \text{if } p \leq q \\ \sum_{i=n-k+1}^{n} \binom{n}{i} & \text{if } p > q. \end{cases} \quad (6)$$

Equation (6) indicates that if p is less than or equal to q, i.e., if the probability that the memoryless source outputs a zero is less than or equal to the probability it outputs a one, then the first top-most equation is used to calculate the group index. However, if p is greater than q, i.e., if the probability that the memoryless source outputs a zero is greater than the probability it outputs a one, then the second lower equation is used to calculate the group index.

The effect of equation (6) is to determine a group index although it should be clarified that these group indexes are not normally sequential in nature. To illustrate with regard to the four binary sequences provided above, i.e., 00, 01, 10, 11, the total length n of these sequences is equals two. Assuming p is less than or equal to q, the group index for binary sequence 00 is 0, for binary sequence 01 is 1 (2 choose 0 equals 1), for binary sequence 10 is 1 (2 choose 0 equals 1, and for binary sequence 11 is 3 (2 choose 0 plus 2 choose 1 equals three). When p is greater than q, the group indexes are reversed such that the group index for 11 is 0, for 10 is 1, for 01 is 1 and for 00 is three. In other words, this group index identifies the number of all binary sequences of the same length that have less than the number of total ones as the currently identified binary sequence. For example, when p is less than or equal to q, the group index for 11 is three indicating that three binary sequences of length two have 1 or less total number of ones than the total number of ones for the currently identified binary sequence 11 (in this example, those binary sequences are 00, 01 and 10 for a total of three). In this way, the group index indicates a relative ordering of the current binary sequence with regard to those possible binary sequences of the same length output from the memoryless source that have both the same number of ones and all those who have less than (in the case when p is less than or equal to q) or greater than (in the case when p is greater than q) total number of ones.

As noted above, the order of the sequence of bits has no impact on the probabilities of these sequences meaning that some set way should be provided by which to distinguish binary sequences that both reside in the same groups. In other words, binary sequences 01 and 10 both fall within the same group, and merely signaling the determined group index and probability indicator 66 identifying by which method the group index was calculated would not suffice as the decoder could not distinguish 01 and 10 from a group index. One way to distinguish these from one another is to provide a set way of ordering the binary sequences of the same length and with the same number of ones in their given group, such as a lexicographic ordering. A lexicographic ordering may order the exemplary binary sequences 01 and 10 as 01 and 10 within the group and then a local index may be assigned to each of these binary sequences within the group such that binary sequence 01 is identified by local index 0 and 10 as local index 1. Determining such a local index for any given binary sequence x of length n having the total number of ones k can be expressed mathematically in accordance with the following equation (7):

$$\text{local\_index}(x; k, n) = \sum_{i=1}^{n} x_i \binom{n-i}{\sum_{j=i}^{n} x_j}. \tag{7}$$

Local index computation unit 60 may implement equation (7) to determine a local index based on the determined total number of ones and the bits in binary sequence x (113). The binomial coefficient expression in equation (7) may be stored as a pre-computed array of binomial coefficients which is indexed based on possible values output by both of expressions n−i and $\Sigma_{j=i}^{n} x_j$. Alternatively, involved binomial coefficients may be computed in accordance with the following relations expressed in equations (8) and (9):

$$\binom{n-1}{k-1} = \frac{k}{n}\binom{n}{k} \tag{8}$$

$$\binom{n-k}{k} = \frac{n-k}{n}\binom{n}{k}. \tag{9}$$

Based on these determined group index and local index, index computation unit 64 may determine index 68 (114). Index computation unit 64 may determine this index 68 for blocks 48, which again represent binary sequence x in these examples, in accordance with the following equation (10):

$$\text{index}(x) = \text{group\_index}(k) + \text{local\_index}(x; n, k). \tag{10}$$

Index computation unit 64 may output index 68 to format unit 54, which formats index 68 and the probability, which is probability indicator 66 in this example, in the bit stream using start codes do denote the single NAL unit that stores index 68 and probability indicator 64, as described above (115). Format unit 54 then outputs the bit stream.

This index identifies the sequence in an array of all possible sequences ordered according to probabilities of the possible sequences assuming the possible sequences are produced by a memoryless source. The index may be computed directly from equation (10), where computing the index using equation (10) does not involve or otherwise require computing, generating or otherwise producing the array of all possible sequences. Equations (6), (7) and (10) may be employed to directly compute the index. In effect, these equations generate the index based on a number of statistical assumptions regarding probability distributions of possible sequences produced by a memoryless source. Based on these statistical assumptions, equations (6), (7) and (10) directly compute, without generating the array of all possible sequences, the index that identifies the relative order of a given sequence in an imaginary or logical construct that represents all possible sequences output by a memoryless source ordered according to their respective probabilities. The techniques described in this disclosure should therefore not be limited to require actual generation of the array of all possible sequences.

As mentioned above, it may be that the probability with which the memoryless source outputs a zero (denoted as p above) and a one (denoted as q above) is not known. In these instances, probability unit 56 can determine a Krichevsky-Trofimov (KT) estimate of the probabilities in accordance with the following equation (11):

$$P_{KT}(k) = \frac{\Gamma(k+1/2)\Gamma(n-k+1/2)}{\pi\Gamma(n+1)}, \tag{11}$$

where $\Gamma(.)$ is a gamma function. More information regarding this formula can be found in a paper authored by R. E. Krichevsky and V. K. Trofimov, entitled "The Performance of Universal Encoding," published in IEEE Trans. Inform. Theory, vol. 27, no. 2, pp. 199-207, 1981. Again, such estimated probabilities depend on the number of ones k and a similar partition of sequences into groups of the same probability results. Moreover, due to symmetry, these probabilities can be express in accordance with the following equation (12):

$$P_{KT}(k) = P_{KT}(n-k). \tag{12}$$

Using these probabilities, the group index can be computed in accordance with the following equation (13):

$$\text{group\_index}(k) = \begin{cases} 2\sum_{i=0}^{k-1}\binom{n}{i} & \text{if } k \leq n-k \\ 2\sum_{i=0}^{n-k-1}\binom{n}{i} + \binom{n}{n-k} & \text{if } k > n-k. \end{cases} \tag{13}$$

In equation (13), the determination of whether to use the top or bottom expression rests only on the number of ones in the given binary sequence, meaning that probability indicator 66 signals whether the number of ones used to define binary sequence x (i.e., blocks 48 in this example) is less than or equal to or greater than the number of zeros used to define binary sequence x. The local index is still computed in the same manner as that described above with respect to equations (7)-(9).

In addition, while described above with respect to memoryless sources in general, the techniques may be adapted in such a manner as to better code certain types of memoryless sources, such as those that output binary sequences in a manner that can be approximated by a particular type of distribution. For example, the distribution of residual video data may be closely approximated by a geometric distribution. To determine the probabilities with which this assumed geometric source may output a one, probability unit 56 may employ a geometric model that can be expressed mathematically as the following equation (14):

$$P(y_i) = (1-\theta)\theta^{y_i}, \quad (14)$$

where $\theta \in (0, 1)$ is some parameter and $y_i$ denotes a residual value of a block. Given equation (14), the probability of a block $y_1, \ldots, y_n$ (where n is assumed to equal N×M tand that residual can be enumerated as $y_1, \ldots, y_n$, for example, by scanning them in raster-scan order) can be expressed in accordance with the following equation (15):

$$P(y_1, \ldots, y_n) = \prod_{i=1}^{n} P(y_i) = (1-\theta)^n \theta^S, \quad (15)$$

where S is the sum of the residual of the block $y_1, \ldots y_n$. The total S may, in a binary system, equal the total number of ones, denoted above as k. In this manner, summing unit 58 may sum the number of ones of residual block $y_1, \ldots, y_n$ to determine a total number of ones S (111). From equation (15) it can be determined that the probabilities of the blocks $P(y_1, \ldots, y_n)$ in the geometric model depends only on the total value S and not on a particular order or values of individual residuals.

Moreover, the total number of all possible combinations of values $y_1, \ldots, y_n$ producing total S is given by a multiset coefficient expressed mathematically as equation (16):

$$\left(\binom{n}{s}\right) = \binom{s+n-1}{n-1}. \quad (16)$$

All blocks containing such combinations, therefore, have the same probability, as noted above. In addition, as the total S increases, the probability of corresponding blocks becomes lower. This relationship between the total S and the probabilities holds true for any value of distribution parameter $\theta$. In view of these relationships, the following equation (17) may be determined for computing an index $i(y_1, \ldots, y_n)$ in a space of all possible blocks, ordered in the decreasing probability order:

$$i(y_1, \ldots, y_n) = \sum_{s=0}^{S-1} \left(\binom{n}{s}\right) + \sum_{j=1}^{n-2} \sum_{k=0}^{y_j-1} \left(\binom{n-j}{S-k-\sum_{l=1}^{j-1} y_l}\right) + y_{n-1}. \quad (17)$$

Group index computation unit 60 may implement the first summation following the equal sign in equation (17) to compute a group index while local index computation unit 62 may implement the second double summation following the equal sign in equation (18) to compute a local index. Group index computation unit 60, when implementing equation (17) may therefore determine a group index based on the determined total number of ones, which in this context is denoted as S (112). Local index computation unit 62 may likewise determine a local index based on the determined total number of ones S and the bits in the binary sequence, which, in this context is denoted as residual values $y_1, \ldots, y_n$ (113). Index computation unit 64 may then sum the determined group index and the determined local index to determine the index in accordance with equation (17). In this manner, index computation unit 64 may determine the index based on the determined group index and the determined local index (114). While the techniques are described as being implemented by three distinct unit 60-64, the techniques may be implemented by a single unit that implements equation (17) and should not be limited in this respect to the examples set forth in this disclosure.

With pre-computed coefficients computed in accordance with equation (17), equation (17) generally requires only about 2 S additions. Equation (17) also establishes a bijective mapping between input blocks $y_1, \ldots, y_n$ and indices $i(y_1, \ldots, y_n)$ that can be used as their codes. The one-to-one code for a block $y_1, \ldots, y_n$ is a binary record of an index $i(y_1, \ldots, y_n)$ up to its most significant bit.

Further, while described above with respect to binary sequences, the techniques should not be limited strictly to binary sequences but may be expanded to m-ary sequences (sequences expressed using ternary, quaternary, or any higher m-ary numeral systems). A m-ary memoryless source would therefore output each of these numerals with known probabilities $p_1, \ldots, p_m$. Assuming that $k_1, \ldots, k_m$ ($k_1 + \ldots + k_m = n$) denote frequencies of occurrences of symbols of each kind in an input sequence x. Then, the probability of such a sequence (or a block) x becomes that as expressed in equation (18):

$$Pr(x) = Pr(k_1, \ldots, k_m) = p_1^{k_1} \ldots p_m^{k_m}. \quad (18)$$

In equation (14), it can be observed again that the probabilities depend only on numbers $k_1, \ldots, k_m$ and not on a particular order of symbols in a sequence. Moreover, there are $$\binom{n}{k_1, \ldots, k_m}$$

possible sequences that have same exact probability $Pr(k_1, \ldots, k_m)$.

Given this observation, the ordering of groups of sequences sharing same weights $k_1, \ldots, k_m$, should be ordered such that their probabilities $Pr(k_1, \ldots, k_m)$ are monotonically increasing. It can be observed that the total number of such groups is given by the multiset coefficient expressed in the following equation (19):

$$\left(\binom{k}{m}\right) = \binom{n+m-1}{m-1}, \quad (19)$$

and that asymptotically (for large n) the following expression expressed in equation (20) holds true:

$$\left(\binom{k}{m}\right) \sim \frac{1}{(m-1)!} n^{m-1}. \quad (20)$$

Based on these observations, a look-up table may be created containing indices of each such group ordered according to their probabilities. The basic mapping between frequencies $k_1, \ldots, k_m$ and offset in such a table can be computed in accordance with the following equation (21):

$$\xi(k_1, \ldots, k_m) = \sum_{j=1}^{m-2} \sum_{i=0}^{k_j} \binom{n-i+m-j}{m-j} + k_{m-1}. \quad (21)$$

This table may contain quantities $\xi$ (representative of frequencies of groups), sorted according to increasing probabilities of such groups as $\Sigma$.

Then, combining these observations, the following algorithm can be defined for computing an index of a particular input sequence x:

1) count the number of symbols of each kind in input sequence:

$$\forall i=1 \ldots m : k_i = \Sigma_{j=1}^n [x_j = i];$$

2) compute sequence type index:

$$\xi(k_1, \ldots, k_m) = \sum_{j=1}^{m-2} \sum_{i=0}^{k_j} \binom{n-i+m-j}{m-j} + k_{m-1}$$

3) compute code-offset of a group of sequences with the same type:

$$\text{group\_index}(k_1, \ldots, k_m) = 0;$$
$$\text{for}(j = 0; \Sigma[j] \mathrel{!}= \xi; j{+}{+})$$
$$\text{group\_index}(k_1, \ldots, k_m) \mathrel{+}= \binom{n}{k_1(\Sigma[j]) \ldots k_m(\Sigma[j])};$$

4) compute full index of a given input sequence x:

index(x)=group_index($k_1, \ldots, k_m$)+local_index(x;n,$k_1, \ldots, k_m$);

Where the last term local_index(x; n, $k_1, \ldots, k_m$); is a lexicographic index of a sequence x in a set of $$\binom{n}{k_1, \ldots, k_m}$$

sequences of same probability, computed using combinatorial enumeration, as described above.

Again, the above application of the techniques to m-ary sources assumes that the probabilities are known. This may not always be the case and, when not, the same techniques described in the previous binary case where the probabilities are not known may be applied to this m-ary case to estimate the probabilities using a KT-estimate function in which case the follow equation (23) and (24) are used:

$$Pr(x) = Pr(k_1, \ldots, k_m) = p_1^{k_1} \ldots p_m^{k_m}; \text{ and} \quad (23)$$

$$P_{KT}(k_1, \ldots, k_m) = \frac{\Gamma(m/2) \prod_{i=1 \ldots m} \Gamma(k_i + 1/2)}{\Gamma(1/2)^m \Gamma(n + m/2)}. \quad (24)$$

Various implementation aspects are discussed below for exemplary purposes with that discuss an example way of implementing the coding techniques described in this disclosure. While these implementation aspects are provided, the techniques of this disclosure should not be limited to this particular implementation, which again is provided only for exemplary purposes. Set forth below is pseudocode that generally implements the techniques in accordance with equations (1)-(10) set forth above with respect to a binary source with known probabilities of p and q.

```
/****************************************
 * Enumeration of (n,k) sequences:
 ****************************************/
/* max. block length: */
#define N_MAX 100
/* Pascal's triangle: */
static int *binomial[N_MAX+1], b_data[(N_MAX+1) * (N_MAX+2) /
2]; /*~2.5K */
/* initialize Pascal triangle */
static void compute_binomial_coeffs (void)
{
    int n, k; unsigned *b = b_data;
    for (n=0; n<=N_MAX; n++) {
        binomial[n] = b; b += n + 1;        /* allocate a row */
        binomial[n][0] = binomial[n][n] = 1;   /* set 1st & last coeffs */
        for (k=1; k<n; k++) {
            binomial[n][k] = binomial [n-1][k-1] + binomial[n-1][k];
            /* printf ("binomial[%d][%d]=%d\n", n, k,
            binomial[n][k]); */
        }
    }
}
/* get index of an (n,k) sequence: */
static int index (unsigned w, int n, int k)
{
    int i=0, j;
    for (j=1; j<=n; j++) {
        if (w & (1 << n-j)) {
            if (n-j>=k)
                i += binomial[n-j][k];
            k--;
        }
    }
    return i;
}
```

Figure 7:
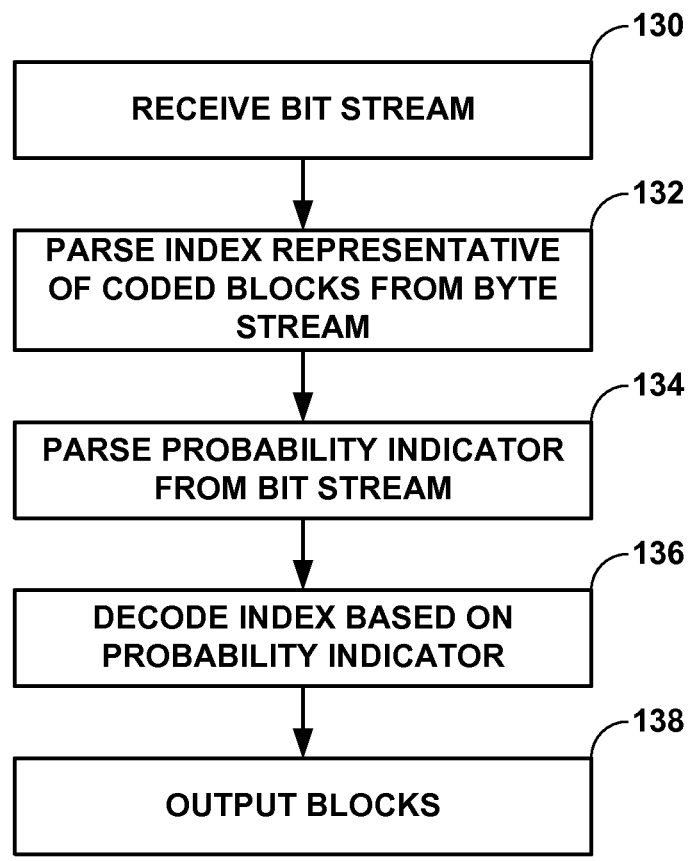
FIG. 7 is a flowchart illustrating exemplary operation of a decoding device in performing the decoding techniques described in this disclosure in more detail.

FIG. 7 is a flowchart illustrating exemplary operation of a coding device, such as entropy decoding unit 64 of FIG. 5, in performing the coding techniques described in this disclosure. Initially, entropy decoding unit 64 receives the bit stream comprised of one or more NAL units denoted by a corresponding start code and a probability indicator, such as probability indicator 66 (130). Inverse format unit 104 parses an index representative of coded blocks 100 from the bit stream (132). Inverse format unit 104 also parses probability indicator 66 from the bit stream (134). Inverse format unit 104 stores coded blocks 100 to storage unit 102 and outputs probability indicator 66 to one-to-one decoding unit 106.

One-to-one decoding unit 106 then decodes the index, which is shown as coded blocks 100 in the example of FIG. 5, based on probability indicator 66 (136). More specifically, one-to-one decoding unit 106, which has previously learned of the total size of blocks 48 denoted as "n" above in the manner described above (i.e., through signaling in one example), is able to determine the group index by successively summing the binomial coefficients of n choose i until the sum is greater than or equal to index 100. This calculation of the group index also depends on the probability indicator. This can be expressed mathematically in accordance with the following equation (20):

$$\text{group\_index}(k) = \begin{cases} \sum_{i=0}^{k-1} \binom{n}{i} & \text{if } p \leq q \\ \sum_{i=n-k+1}^{n} \binom{n}{i} & \text{if } p > q. \end{cases} \quad (20)$$

If the resulting sum of adding the next binomial coefficient is greater than the index, one-to-one decoding unit 106 determines the group index as the current sum without adding the next binomial coefficient.

The number of iterations to compute the group index further indicates the number of ones or zeros in blocks 100. For example, the first iteration when probability indicator 66 signals p is less than or equal to q, indicates that there is one binary sequence with all ones, i.e., n choose zero equals one, which suggests that this first iteration computes the binary coefficient for the binary sequence with no zeros. The second iteration then computes the number of binary sequences that have one zero, etc. From this iteration count, k can be determined by subtracting the iteration count from n, yielding the total number of ones in the binary sequence corresponding to index 100.

One-to-one coding unit 106 then determines the local index by subtracting the group index from index 100. Given the local index, blocks 48 may be reproduced by inverting the lexicographic arrangement procedure above. One-to-one coding unit 106 outputs these blocks 48 to the remaining portions of video decoder 26 (138).

The above algorithm may be represented as instructions stored to a non-transitory computer readable medium. These instructions may, as one example, be represented by the following pseudo-code:

```
/* generate an (n,k) sequence using its index: */
static unsigned make_sequence (int i, int n, int k)
{
    unsigned j, b, w = 0;
    for (j=1; j<=n; j++) {
        if (n-j < k) goto l1;
        b = binomial[n-j][k];
        if (i >=b) {
            i -= b;
l1:
            w |= 1U << (n-j);
            k --;
        }
    }
    return w;
}
```

The above code assumes that the k is known, but as noted above, this may be derived or determined as a function of the iteration count.

Figure 8:
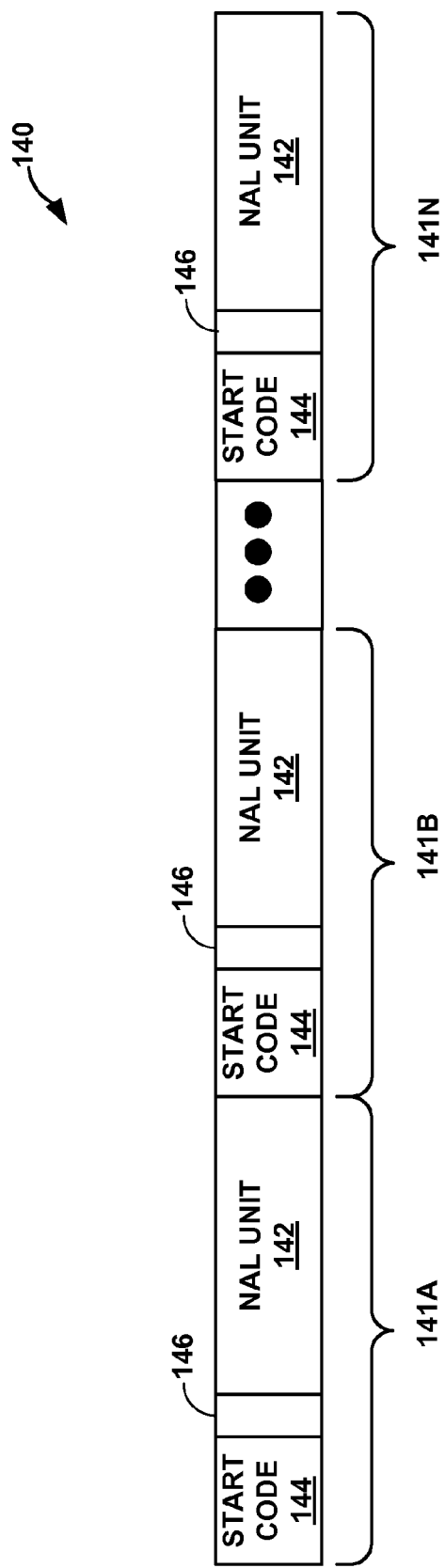
FIG. 8 is a block diagram illustrating an example bit stream formed in accordance with the techniques of this disclosure.

FIG. 8 is a block diagram illustrating an example bit stream 140 formed in accordance with the techniques of this disclosure. As shown in the example of FIG. 8, bit stream 140 includes NAL unit syntax structures 141A-141N, each of which includes a start code 144 denoting the start of a corresponding NAL unit 142. Each NAL unit syntax structure 141A-141N also includes a probability indicator 146, as described above. An approximate rate of sending such an index proceeded by a probability indicator can be expressed mathematically in accordance with the following equation (21):

$$R(n) \sim nH - \tfrac{1}{2} \log_2 n + 1 \quad (21)$$

The techniques described in this disclosure may be implemented within one or more of a general purpose microprocessor, digital signal processor (DSP), application specific integrated circuit (ASIC), field programmable gate array (FPGA), programmable logic devices (PLDs), or other equivalent logic devices or circuits. Accordingly, the terms "processor" or "controller," as used herein, may refer to any one or more of the foregoing structures or any other structure suitable for implementation of the techniques described herein.

The various components illustrated herein may be realized by any suitable combination of hardware, software or firmware executed by a processor, or any combination thereof. In the figures, various components are depicted as separate units or modules. However, all or several of the various components described with reference to these figures may be integrated into combined units or modules within common hardware, and/or firmware or other software executed by a processor or other hardware. Accordingly, the representation of features as components, units or modules is intended to highlight particular functional features for ease of illustration, and does not necessarily require realization of such features by separate hardware, firmware, or software components. In some cases, various units may be implemented as programmable processes performed by one or more processors.

Any features described herein as modules, devices, or components may be implemented together in an integrated logic device or separately as discrete but interoperable logic devices. In various aspects, such components may be formed at least in part as one or more integrated circuit devices, which may be referred to collectively as an integrated circuit device, such as an integrated circuit chip or chipset. Such circuitry may be provided in a single integrated circuit chip device or in multiple, interoperable integrated circuit chip devices, and may be used in any of a variety of image, display, audio, or other multi-multimedia applications and devices. In some aspects, for example, such components may form part of a mobile device, such as a wireless communication device handset (e.g., a mobile telephone handset).

If implemented in software, the techniques may be realized at least in part by a computer-readable data storage medium storing code with instructions that, when executed by one or more processors, performs one or more of the methods described above. The computer-readable storage medium may form part of a computer program product, which may include packaging materials. The computer-readable medium may comprise a non-transitory storage medium such as random access memory (RAM) such as synchronous dynamic random access memory (SDRAM), read-only memory (ROM), non-volatile random access memory (NVRAM), electrically erasable programmable read-only memory (EEPROM), embedded dynamic random access memory (eDRAM), static random access memory (SRAM), flash memory, magnetic or optical data storage media. To the extent such mediums are embodied as physical storage devices or memories, the computer-readable medium may represent a non-transitory computer readable medium. Any software that is utilized may be executed by one or more processors, such as one or more DSP's, general purpose microprocessors, ASIC's, FPGA's, or other equivalent integrated or discrete logic circuitry.

Various aspects have been described in this disclosure. These and other aspects are within the scope of the following claims.

The invention claimed is:

1. A method of encoding data defining a sequence, the method comprising:

computing, with an apparatus, an index representative of the sequence using a combinatorial enumeration process, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities; and storing, with the apparatus, the computed index as a one-to-one code representative of the sequence, wherein the one-to-one code does not satisfy a prefix property requiring that a code cannot be a prefix of another code.

2. The method of claim 1, wherein the binary sequence is assumed to be output by a memoryless source in accordance with a geometric distribution;

wherein computing the index includes:

determining a number of ones in the binary sequence, where the number of ones is denoted by the variable S and the binary sequence is denoted as $y_1, \ldots, y_n$:

$$S = \sum_{j=1}^{n} y_j;$$

and computing the index in accordance with the following equation, where the index is denoted as i:

$$i(y_1, \ldots, y_n) = \sum_{s=0}^{S-1} \left(\binom{n}{s}\right) + \sum_{j=1}^{n-2} \sum_{k=0}^{y_j-1} \left(\binom{n-j}{S-k-\sum_{i=1}^{j-1} y_i}\right) + y_{n-1},$$

and where $$\left(\binom{n}{k}\right) = \binom{n+k-1}{k}$$

denotes multiset coefficients.

3. The method of claim 1, wherein the binary sequence is assumed to be output by a binary memoryless source with unknown probabilities, wherein computing the index includes:

computing a number of ones in the binary sequence, where the number of ones is denoted by the variable k, the binary sequence is denoted by the variable x and a total number of bits in the binary sequence is denoted by the variable n;

computing a group index for the binary sequence in accordance with the following equation:

$$\text{group\_index}(k) = \begin{cases} 2\sum_{i=0}^{k-1}\binom{n}{i} & \text{if } k \leq n-k \\ 2\sum_{i=0}^{n-k-1}\binom{n}{i} + \binom{n}{n-k} & \text{if } k > n-k; \end{cases}$$

computing a local index for the binary sequence in accordance with the following equation:

$$\text{local\_index}(x; k, n) = \sum_{i=1}^{n} x_i \left(\sum_{j=i}^{n} x_j \atop n-i\right);$$

computing the index in accordance with the following equation:

$$\text{index}(x) = \text{group\_index}(k_1, \ldots, k_m) + \text{local\_index}(x; n, k_1, \ldots, k_m).$$

4. The method of claim 1, wherein the binary sequence is assumed to be output by a binary memoryless source with known probabilities of zero and one, denoted by p and q correspondingly, wherein computing the index includes:

computing a number of ones in the binary sequence, where the number of ones is denoted by the variable k and where the binary sequence is denoted by the variable x;

computing a group index for the binary sequence in accordance with the following equation:

$$\text{group\_index}(k) = \begin{cases} \sum_{i=0}^{k-1}\binom{n}{i} & \text{if } p \leq q \\ \sum_{i=n-k+1}^{n}\binom{n}{i} & \text{if } p > q; \end{cases}$$

computing a local index for the binary sequence in accordance with the following equation:

$$\text{local\_index}(x; k, n) = \sum_{i=1}^{n} x_i \left(\sum_{j=i}^{n} x_j \atop n-i\right);$$

computing the index in accordance with the following equation:

$$\text{index}(x) = \text{group\_index}(k_1, \ldots, k_m) + \text{local\_index}(x; n, k_1, \ldots, k_m).$$

5. The method of claim 1, wherein computing the index includes:

determining a number of ones in the sequence;

computing a group index for the sequence based on the determined number of ones, wherein the group index identifies a position of the sequence relative to those of the possible sequences that have a same probability as that of the sequence; and computing the index based on the computed group index.

6. The method of claim 5, further comprising determining a probability with which the memoryless source outputs a one, wherein computing a group index comprises computing a group index based on the determined probability with which the memoryless source outputs a one.

7. The method of claim 1, wherein computing the index includes:

computing a local index for the sequence to uniquely identify the sequence within those of the possible sequences that have the same probability as that of the sequence; and computing the index based on the computed group index.

8. The method of claim 7, wherein computing a local index comprises computing a local index that identifies a position of the sequence in a lexicographic ordering of those of the possible sequences that have the same probability as that of the sequence.

9. The method of claim 1, further comprising:

formatting a bit stream to include the computed index as a network layer abstraction (NAL) unit such that a start of the NAL unit is signaled by a start code; and transmitting the bit stream via a wireless channel to a receiving device.

10. The method of claim 1, wherein the sequence comprises a binary sequence.

11. The method of claim 1, wherein the sequence defines one or more blocks of residual pixel data or discrete cosine transformation (DCT) coefficients of transformed residual pixel data, wherein the apparatus comprises a video encoder that includes an entropy encoder that computes the index, wherein the index represents a coded version of the one or more blocks of residual pixel data or DCT coefficients.

12. An apparatus for encoding data defining a sequence, the apparatus comprising:

means for computing an index representative of the sequence using a combinatorial enumeration process, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities; and means for storing the computed index as a one-to-one code representative of the sequence, wherein the one-to-one code does not satisfy a prefix property requiring that a code cannot be a prefix of another code.

13. The apparatus of claim 12, wherein the binary sequence is assumed to be output by a memoryless source in accordance with a geometric distribution;

wherein the means for computing the index includes:

means for determining a number of ones in the binary sequence, where the number of ones is denoted by the variable S and the binary sequence is denoted as $y_1, \ldots, y_n$:

$$S = \sum_{j=1}^{n} y_j;$$

and means for computing the index in accordance with the following equation, where the index is denoted as i:

$$i(y_1, \ldots, y_n) = \sum_{s=0}^{S-1} \left(\binom{n}{s}\right) + \sum_{j=1}^{n-2} \sum_{k=0}^{y_j-1} \left(\binom{n-j}{S-k-\sum_{i=1}^{j-1} y_i}\right) + y_{n-1},$$

and where $$\left(\binom{n}{k}\right) = \binom{n+k-1}{k}$$

denotes multiset coefficients.

14. The apparatus of claim 12, wherein the binary sequence is assumed to be output by a binary memoryless source with unknown probabilities, wherein the means for computing the index includes:

means for computing a number of ones in the binary sequence, where the number of ones is denoted by the variable k, the binary sequence is denoted by the variable x and a total number of bits in the binary sequence is denoted by the variable n;

means for computing a group index for the binary sequence in accordance with the following equation:

$$\text{group\_index}(k) = \begin{cases} 2\sum_{i=0}^{k-1} \binom{n}{i} & \text{if } k \leq n-k \\ 2\sum_{i=0}^{n-k-1} \binom{n}{i} + \binom{n}{n-k} & \text{if } k > n-k; \end{cases}$$

means for computing a local index for the binary sequence in accordance with the following equation:

$$\text{local\_index}(x; k, n) = \sum_{i=1}^{n} x_i \binom{n-i}{\sum_{j=i}^{n} x_j};$$

and means for computing the index in accordance with the following equation:

index(x)=group_index($k_1, \ldots k_m$)+local_index
(x;n,$k_1, \ldots, k_m$).

15. The apparatus of claim 12, wherein the binary sequence is assumed to be output by a binary memoryless source with known probabilities of zero and one, denoted by p and q correspondingly, wherein the means for computing the index includes:

means for computing a number of ones in the binary sequence, where the number of ones is denoted by the variable k and where the binary sequence is denoted by the variable x;

means for computing a group index for the binary sequence in accordance with the following equation:

$$\text{group\_index}(k) = \begin{cases} \sum_{i=0}^{k-1} \binom{n}{i} & \text{if } p \leq q \\ \sum_{i=n-k+1}^{n} \binom{n}{i} & \text{if } p > q; \end{cases}$$

means for computing a local index for the binary sequence in accordance with the following equation:

$$\text{local\_index}(x; k, n) = \sum_{i=1}^{n} x_i \binom{n-i}{\sum_{j=i}^{n} x_j};$$

means for computing the index in accordance with the following equation:

$\text{index}(x) = \text{group\_index}(k_1, \ldots, k_m) + \text{local\_index}(x; n, k_1, \ldots, k_m).$

16. The apparatus of claim 12, wherein the means for computing the index includes:
means for determining a number of ones in the sequence;
means for computing a group index for the sequence based on the determined number of ones, wherein the group index identifies a position of the sequence relative to those of the possible sequences that have a same probability as that of the sequence; and
means for computing the index based on the computed group index.

17. The apparatus of claim 16, further comprising means for determining a probability with which the memoryless source outputs a one,
wherein the means for computing a group index comprises means for computing a group index based on the determined probability with which the memoryless source outputs a one.

18. The apparatus of claim 12, wherein the means for computing the index includes:
means for computing a local index for the sequence to uniquely identify the sequence within those of the possible sequences that have the same probability as that of the sequence; and
means for computing the index based on the computed group index.

19. The apparatus of claim 18, wherein the means for computing a local index comprises means for computing a local index that identifies a position of the sequence in a lexicographic ordering of those of the possible sequences that have the same probability as that of the sequence.

20. The apparatus of claim 12, further comprising:
means for formatting a bit stream to include the computed index as a network layer abstraction (NAL) unit such that a start of the NAL unit is signaled by a start code; and
means for transmitting the bit stream via a wireless channel to a receiving device.

21. The apparatus of claim 12, wherein the sequence comprises a binary sequence.

22. The apparatus of claim 12,
wherein the sequence defines one or more blocks of residual pixel data or discrete cosine transformation (DCT) coefficients of transformed residual pixel data,
wherein the apparatus comprises a video encoder that includes an entropy encoder that computes the index,
wherein the index represents a coded version of the one or more blocks of residual pixel data or DCT coefficients.

23. An apparatus for encoding data defining a sequence, the apparatus comprising:
a processing unit that computes an index representative of the sequence using a combinatorial enumeration process, wherein the index identifies the sequence in an array of all possible sequences ordered according to probabilities of the possible sequences assuming the possible sequences are produced by a memoryless source, and wherein the combinatorial enumeration process reorders sequences from the memoryless source according to the corresponding probabilities; and
a storage unit that stores the computed index as a one-to-one code representative of the sequence, wherein the one-to-one code does not satisfy a prefix property requiring that a code cannot be a prefix of another code.

24. The apparatus of claim 23,
wherein the binary sequence is assumed to be output by a memoryless source in accordance with a geometric distribution;
wherein the processing unit further determines a number of ones in the binary sequence, where the number of ones is denoted by the variable S and the binary sequence is denoted as $y_1, \ldots, y_n$:

$$S = \sum_{j=1}^{n} y_j;$$

and which computes the index in accordance with the following equation, where the index is denoted as i:

$$i(y_1, \ldots, y_n) = \sum_{s=0}^{S-1} \left(\binom{n}{s}\right) + \sum_{j=1}^{n-2} \sum_{k=0}^{y_j-1} \left(\binom{n-j}{S-k-\sum_{l=1}^{j-1} y_l}\right) + y_{n-1},$$

and where $$\left(\binom{n}{k}\right) = \binom{n+k-1}{k}$$

denotes multiset coefficients.

25. The apparatus of claim 23,
wherein the binary sequence is assumed to be output by a binary memoryless source with unknown probabilities,
wherein the processing unit further computes a number of ones in the binary sequence, where the number of ones is denoted by the variable k, the binary sequence is denoted by the variable x and a total number of bits in the binary sequence is denoted by the variable n, computes a group index for the binary sequence in accordance with the following equation:

$$\text{group\_index}(k) = \begin{cases} 2\sum_{i=0}^{k-1}\binom{n}{i} & \text{if } k \leq n-k \\ 2\sum_{i=0}^{n-k-1}\binom{n}{i} + \binom{n}{n-k} & \text{if } k > n-k, \end{cases}$$

computes a local index for the binary sequence in accordance with the following equation:

$$\text{local\_index}(x; k, n) = \sum_{i=1}^{n} x_i \binom{n-i}{\sum_{j=i}^{n} x_j},$$

computes the index in accordance with the following equation:

index($x$)=group_index($k_1, \ldots, k_m$)+local_
  index($x;n,k_1, \ldots, k_m$).

26. The apparatus of claim 23,
wherein the binary sequence is assumed to be output by a binary memoryless source with known probabilities of zero and one, denoted by p and q correspondingly,
wherein the processing unit further computes a number of ones in the binary sequence, where the number of ones is denoted by the variable k and where the binary sequence is denoted by the variable x, computes a group index for the binary sequence in accordance with the following equation:

$$\text{group\_index}(k) = \begin{cases} \sum_{i=0}^{k-1}\binom{n}{i} & \text{if } p \leq q \\ \sum_{i=n-k+1}^{n}\binom{n}{i} & \text{if } p > q, \end{cases}$$

computes a local index for the binary sequence in accordance with the following equation:

$$\text{local\_index}(x; k, n) = \sum_{i=1}^{n} x_i \binom{n-i}{\sum_{j=i}^{n} x_j},$$

and computes the index in accordance with the following equation:

index($x$)=group_index($k_1, \ldots, k_m$)+local_index($x;n,k_1, \ldots, k_m$).

27. The apparatus of claim 23, wherein the processing unit further determines a number of ones in the sequence, computes a group index for the sequence based on the determined number of ones, wherein the group index identifies a position of the sequence relative to those of the possible sequences that have a same probability as that of the sequence and computes the index based on the computed group index.

28. The apparatus of claim 27, wherein the processing unit further determines a probability with which the memoryless source outputs a one and computes a group index based on the determined probability with which the memoryless source outputs a one.

29. The apparatus of claim 23, wherein the processing unit further computes a local index for the sequence to uniquely identify the sequence within those of the possible sequences that have the same probability as that of the sequence and computes the index based on the computed group index.

30. The apparatus of claim 29, wherein the processing unit further computes a local index that identifies a position of the sequence in a lexicographic ordering of those of the possible sequences that have the same probability as that of the sequence.

31. The apparatus of claim 23, wherein the processing unit further formats a bit stream to include the computed index as a network layer abstraction (NAL) unit such that a start of the NAL unit is signaled by a start code and transmits the bit stream via a wireless channel to a receiving device.

32. The apparatus of claim 23, wherein the sequence comprises a binary sequence.

33. The apparatus of claim 23,
wherein the sequence defines one or more blocks of residual pixel data or discrete cosine transformation (DCT) coefficients of transformed residual pixel data,
wherein the apparatus comprises a video encoder that includes an entropy encoder that computes the index,
wherein the index represents a coded version of the one or more blocks of residual pixel data or DCT coefficients.

34. A non-transitory computer-readable medium storing instructions for encoding data that defines a sequence, the instructions, when executed, cause the one or more processors to:
compute an index representative of the sequence using a combinatorial enumeration process, wherein the index identifies the sequence in an array of all possible sequences ordered according to a probability that each of the possible sequences are output from a memoryless source, and wherein the combinatorial enumeration process reorders sequences from the memoryless source according to the corresponding probability that each of the possible sequences are output from the memoryless source; and
store the computed index as a one-to-one code representative of the sequence, wherein the one-to-one code does not satisfy a prefix property requiring that a code cannot be a prefix of another code.

35. The non-transitory computer-readable medium of claim 34,
wherein the binary sequence is assumed to be output by a memoryless source in accordance with a geometric distribution;
wherein the non-transitory computer-readable medium further comprises instructions that, when executed, cause the one or more processors to:
determine a number of ones in the binary sequence, where the number of ones is denoted by the variable S and the binary sequence is denoted as $y_1, \ldots, y_n$:

$$S = \sum_{j=1}^{n} y_j;$$

and
compute the index in accordance with the following equation, where the index is denoted as i:

$$i(y_1, \ldots, y_n) = \sum_{s=0}^{S-1}\left(\!\!\binom{n}{s}\!\!\right) + \sum_{j=1}^{n-2}\sum_{k=0}^{y_j-1}\left(\!\binom{n-j}{S-k-\sum_{l=1}^{j-1}y_l}\!\right) + y_{n-1},$$

and where $$\left(\!\!\binom{n}{k}\!\!\right) = \binom{n+k-1}{k}$$

denotes multiset coefficients.

36. The non-transitory computer-readable medium of claim 34, wherein the sequence is assumed to be output by a binary memoryless source with unknown probabilities,
  wherein the non-transitory computer-readable medium further comprises instructions that, when executed, cause the one or more processors to:
  compute a number of ones in the binary sequence, where the number of ones is denoted by the variable k, the binary sequence is denoted by the variable x and a total number of bits in the binary sequence is denoted by the variable n;
  compute a group index for the binary sequence in accordance with the following equation:

$$\text{group\_index}(k) = \begin{cases} 2\sum_{i=0}^{k-1}\binom{n}{i} & \text{if } k \leq n-k \\ 2\sum_{i=0}^{n-k-1}\binom{n}{i} + \binom{n}{n-k} & \text{if } k > n-k; \end{cases}$$

compute a local index for the binary sequence in accordance with the following equation:

$$\text{local\_index}(x; k, n) = \sum_{i=1}^{n} x_i \left(\!\!\!\begin{array}{c} n-i \\ \sum_{j=i}^{n} x_j \end{array}\!\!\!\right);$$

and
compute the index in accordance with the following equation:

index(x)=group_index($k_1, \ldots, k_m$)+local_index(x;n,$k_1, \ldots, k_m$).

37. The non-transitory computer-readable medium of claim 34,
  wherein the sequence is assumed to be output by a binary memoryless source with known probabilities of zero and one, denoted by p and q correspondingly,
  wherein the non-transitory computer-readable medium further comprises instructions that, when executed, cause the one or more processors to:
  determining a number of ones in the binary sequence, where the number of ones is denoted by the variable k and where the binary sequence is denoted by the variable x;

compute a group index for the binary sequence in accordance with the following equation:

$$\text{group\_index}(k) = \begin{cases} \sum_{i=0}^{k-1}\binom{n}{i} & \text{if } p \leq q \\ \sum_{i=n-k+1}^{n}\binom{n}{i} & \text{if } p > q; \end{cases}$$

compute a local index for the binary sequence in accordance with the following equation:

$$\text{local\_index}(x; k, n) = \sum_{i=1}^{n} x_i \left(\!\!\!\begin{array}{c} n-i \\ \sum_{j=i}^{n} x_j \end{array}\!\!\!\right);$$

and
compute the index in accordance with the following equation:

index(x)=group_index($k_1, \ldots, k_m$)+local_index(x;n,$k_1, \ldots, k_m$).

38. A method of decoding an index that represents a coded sequence as a one-to-one code, the method comprising:
  decoding, with an apparatus, the index using a combinatorial enumeration process to generate a sequence, wherein the index identifies the sequence in an array of all possible sequences ordered according to probabilities of the possible sequences assuming the possible sequences are produced by a memoryless source, wherein the one-to-one code does not satisfy a prefix property requiring that a code cannot be a prefix of another code, and wherein the combinatorial enumeration process reorders sequences from the memoryless source according to the corresponding probabilities; and
  storing the sequence.

39. The method of claim 38,
  wherein the sequence is assumed to be output by a memoryless source in accordance with a geometric distribution;
  wherein decoding the index includes:
  determining a number of ones in the binary sequence, where the number of ones is denoted by the variable S and the binary sequence is denoted as $y_1, \ldots, y_n$:

$$S = \sum_{j=1}^{n} y_j;$$

and
decoding the index generated using the following equation to generate the sequence based on the total number of ones, where the index is denoted by the variable i:

$$i(y_1, \ldots, y_n) = \sum_{s=0}^{S-1}\left(\!\!\binom{n}{s}\!\!\right) + \sum_{j=1}^{n-2}\sum_{k=0}^{y_j-1}\left(\!\binom{n-j}{S-k-\sum_{l=1}^{j-1}y_l}\!\right) + y_{n-1},$$

-continued and where $$\left(\binom{n}{k}\right) = \binom{n+k-1}{k}$$

denotes multiset coefficients.

40. The method of claim 38,
wherein the sequence is assumed to be output by a binary memoryless source with unknown probabilities,
wherein decoding the index includes:
determining a number of ones in the binary sequence, where the number of ones is denoted by the variable k, the binary sequence is denoted by the variable x and a total number of bits in the binary sequence is denoted by the variable n;
determining a group index for the binary sequence, where the group index is computed in accordance with the following equation:

$$\text{group\_index}(k) = \begin{bmatrix} 2\sum_{i=0}^{k-1}\binom{n}{i} & \text{if } k \leq n-k \\ 2\sum_{i=0}^{n-k-1}\binom{n}{i} + \binom{n}{n-k} & \text{if } k > n-k; \end{bmatrix}$$

determining a local index for the binary sequence, wherein the local index is computed in accordance with the following equation:

$$\text{local\_index}(x; k, n) = \sum_{i=1}^{n} x_i \left(\sum_{j=i}^{n} x_j\right); \text{ and}$$

decoding the index based on the determined group index and the determined local index.

41. The method of claim 38,
wherein the sequence is assumed to be output by a binary memoryless source with known probabilities of zero and one, denoted by p and q correspondingly,
wherein decoding the index includes:
determining a number of ones in the binary sequence, where the number of ones is denoted by the variable k and where the binary sequence is denoted by the variable x;
determining a group index for the binary sequence, where the group index is computed in accordance with the following equation:

$$\text{group\_index}(k) = \begin{bmatrix} \sum_{i=0}^{k-1}\binom{n}{i} & \text{if } p \leq q \\ \sum_{i=n-k+1}^{n}\binom{n}{i} & \text{if } p > q; \end{bmatrix}$$

determining a local index for the binary sequence, wherein the local index is computed in accordance with the following equation:

$$\text{local\_index}(x; k, n) = \sum_{i=1}^{n} x_i \left(\sum_{j=i}^{n} x_j\right); \text{ and}$$

decoding the index based on the determined group index and the determined local index to generate the sequence.

42. An apparatus of decoding an index that represents a coded sequence as a one-to-one code, the apparatus comprising:
means for decoding the index using a combinatorial enumeration process to generate a sequence, wherein the index identifies the sequence in an array of all possible sequences ordered according to probabilities of the possible sequences assuming the possible sequences are produced by a memoryless source, wherein the one-to-one code does not satisfy a prefix property requiring that a code cannot be a prefix of another code, and wherein the combinatorial enumeration process reorders sequences from the memoryless source according to the corresponding probabilities; and
means for storing the sequence.

43. The apparatus of claim 42,
wherein the sequence is assumed to be output by a memoryless source in accordance with a geometric distribution;
wherein the apparatus further comprises:
means for determining a number of ones in the binary sequence, where the number of ones is denoted by the variable S and the binary sequence is denoted as $y_1, \ldots, y_n$:

$$S = \sum_{j=1}^{n} y_j;$$

and
means for decoding the index generated using the following equation to generate the sequence based on the total number of ones, where the index is denoted by the variable i:

$$i(y_1, \ldots, y_n) = \sum_{s=0}^{S-1}\left(\binom{n}{s}\right) + \sum_{j=1}^{n-2}\sum_{k=0}^{y_j-1}\left(\binom{n-j}{S-k-\sum_{l=1}^{j-1}y_l}\right) + y_{n-1},$$

and where $$\left(\binom{n}{k}\right) = \binom{n+k-1}{k}$$

denotes multiset coefficients.

44. The apparatus of claim 42,
wherein the sequence is assumed to be output by a binary memoryless source with unknown probabilities,
wherein the apparatus further comprises:
means for determining a number of ones in the binary sequence, where the number of ones is denoted by the variable k, the binary sequence is denoted by the variable x and a total number of bits in the binary sequence is denoted by the variable n;
means for determining a group index for the binary sequence, where the group index is computed in accordance with the following equation:

$$\text{group\_index}(k) = \begin{cases} 2\sum_{i=0}^{k-1}\binom{n}{i} & \text{if } k \leq n-k \\ 2\sum_{i=0}^{n-k-1}\binom{n}{i} + \binom{n}{n-k} & \text{if } k > n-k; \end{cases}$$

means for determining a local index for the binary sequence, wherein the local index is computed in accordance with the following equation:

$$\text{local\_index}(x; k, n) = \sum_{i=1}^{n} x_i \binom{n-i}{\sum_{j=i}^{n} x_j};$$

and means for decoding the index based on the determined group index and the determined local index.

45. The apparatus of claim 42,
wherein the sequence is assumed to be output by a binary memoryless source with known probabilities of zero and one, denoted by p and q correspondingly,
wherein the apparatus further comprises:
means for determining a number of ones in the binary sequence, where the number of ones is denoted by the variable k and where the binary sequence is denoted by the variable x;
means for determining a group index for the binary sequence, where the group index is computed in accordance with the following equation:

$$\text{group\_index}(k) = \begin{cases} \sum_{i=0}^{k-1}\binom{n}{i} & \text{if } p \leq q \\ \sum_{i=n-k+1}^{n}\binom{n}{i} & \text{if } p > q; \end{cases}$$

means for determining a local index for the binary sequence, wherein the local index is computed in accordance with the following equation:

$$\text{local\_index}(x; k, n) = \sum_{i=1}^{n} x_i \binom{n-i}{\sum_{j=i}^{n} x_j};$$

means for decoding the index based on the determined group index and the determined local index to generate the sequence.

46. An apparatus for decoding an index that represents a coded sequence as a one-to-one code, the apparatus comprising:
a processing unit that decodes the index using a combinatorial enumeration process to generate a sequence, wherein the index identifies the sequence in an array of all possible sequences ordered according to probabilities of the possible sequences assuming the possible sequences are produced by a memoryless source, wherein the one-to-one code does not satisfy a prefix property requiring that a code cannot be a prefix of another code, and wherein the combinatorial enumeration process reorders sequences from the memoryless source according to the corresponding probabilities; and
a storage unit that stores the sequence.

47. The apparatus of claim 46,
wherein the sequence is assumed to be output by a memoryless source in accordance with a geometric distribution;
wherein the processing unit further determines a number of ones in the binary sequence, where the number of ones is denoted by the variable S and the binary sequence is denoted as $y_1, \ldots, y_n$:

$$S = \sum_{j=1}^{n} y_j;$$

and decodes the index generated using the following equation to generate the sequence based on the total number of ones, where the index is denoted by the variable i:

$$i(y_1, \ldots, y_n) = \sum_{s=0}^{S-1}\left(\binom{\binom{n}{s}}{}\right) + \sum_{j=1}^{n-2}\sum_{k=0}^{y_j-1}\left(\binom{n-j}{S-k-\sum_{l=1}^{j-1}y_l}\right) + y_{n-1},$$

and where $$\left(\binom{n}{k}\right) = \binom{n+k-1}{k}$$

denotes multiset coefficients.

48. The apparatus of claim 46,
wherein the sequence is assumed to be output by a binary memoryless source with unknown probabilities,
wherein the processing unit further determines a number of ones in the binary sequence, where the number of ones is denoted by the variable k, the binary sequence is denoted by the variable x and a total number of bits in the binary sequence is denoted by the variable n, determines a group index for the binary sequence, where the group index is computed in accordance with the following equation $$\text{group\_index}(k) = \begin{cases} 2\sum_{i=0}^{k-1}\binom{n}{i} & \text{if } k \leq n-k \\ 2\sum_{i=0}^{n-k-1}\binom{n}{i} + \binom{n}{n-k} & \text{if } k > n-k, \end{cases}$$

determines a local index for the binary sequence, wherein the local index is computed in accordance with the following equation:

$$\text{local\_index}(x; k, n) = \sum_{i=1}^{n} x_i \binom{n-i}{\sum_{j=i}^{n} x_j},$$

and decodes the index based on the determined group index and the determined local index.

49. The apparatus of claim 46,
wherein the sequence is assumed to be output by a binary memoryless source with known probabilities of zero and one, denoted by p and q correspondingly,
wherein the processing unit further determines a number of ones in the binary sequence, where the number of ones is denoted by the variable k and where the binary sequence is denoted by the variable x, determines a group index for the binary sequence, where the group index is computed in accordance with the following equation:

$$\text{group\_index}(k) = \begin{cases} \sum_{i=0}^{k-1} \binom{n}{i} & \text{if } p \leq q \\ \sum_{i=n-k+1}^{n} \binom{n}{i} & \text{if } p > q, \end{cases}$$

determines a local index for the binary sequence, wherein the local index is computed in accordance with the following equation:

$$\text{local\_index}(x; k, n) = \sum_{i=1}^{n} x_i \binom{n-i}{\sum_{j=i}^{n} x_j},$$

and decodes the index based on the determined group index and the determined local index to generate the sequence.

50. A non-transitory computer-readable medium comprising instructions for decoding an index that represents a coded sequence as a one-to-one code, the instructions, when executed, cause one or more processors to:
decode, with an apparatus, the index using a combinatorial enumeration process to generate a sequence, wherein the index identifies the sequence in an array of all possible sequences ordered according to probabilities of the possible sequences assuming the possible sequences are produced by a memoryless source, wherein the one-to-one code does not satisfy a prefix property requiring that a code cannot be a prefix of another code, and wherein the combinatorial enumeration process reorders sequences from the memoryless source according to the corresponding probabilities, and store the sequence.

51. The non-transitory computer-readable medium of claim 38,
wherein the sequence is assumed to be output by a memoryless source in accordance with a geometric distribution;
wherein the non-transitory computer-readable medium further comprises instructions that, when executed, cause the one or more processors to:
determine a number of ones in the binary sequence, where the number of ones is denoted by the variable S and the binary sequence is denoted as $y_1, \ldots, y_n$:

$$S = \sum_{j=1}^{n} y_j;$$

and
decode the index generated using the following equation to generate the sequence based on the total number of ones, where the index is denoted by the variable i:

$$i(y_1, \ldots, y_n) = \sum_{s=0}^{S-1} \left(\!\!\binom{n}{s}\!\!\right) + \sum_{j=1}^{n-2} \sum_{k=0}^{y_j-1} \left(\!\!\binom{n-j}{S-k-\sum_{l=1}^{j-1} y_l}\!\!\right) + y_{n-1},$$

and where $$\left(\!\!\binom{n}{k}\!\!\right) = \binom{n+k-1}{k}$$

denotes multiset coefficients.

* * * * *